(12) United States Patent
Tour et al.

(10) Patent No.: US 12,368,190 B2
(45) Date of Patent: Jul. 22, 2025

(54) SYSTEMS AND METHODS OF DETECTING LI DENDRITES

(71) Applicant: WILLIAM MARSH RICE UNIVERSITY, Houston, TX (US)

(72) Inventors: James M. Tour, Bellaire, TX (US); Tuo Wang, Houston, TX (US); Rodrigo Villegas Salvatierra, Houston, TX (US)

(73) Assignee: William Marsh Rice University, Houston, TX (US)

( * ) Notice: Subject to any disclaimer, the term of this patent is extended or adjusted under 35 U.S.C. 154(b) by 1218 days.

(21) Appl. No.: 16/973,671

(22) PCT Filed: Jun. 11, 2019

(86) PCT No.: PCT/US2019/036609
§ 371 (c)(1),
(2) Date: Dec. 9, 2020

(87) PCT Pub. No.: WO2019/241291
PCT Pub. Date: Dec. 19, 2019

(65) Prior Publication Data
US 2021/0257679 A1 Aug. 19, 2021

Related U.S. Application Data

(60) Provisional application No. 62/683,158, filed on Jun. 11, 2018, provisional application No. 62/720,033, filed on Aug. 20, 2018.

(51) Int. Cl.
*H01M 10/48* (2006.01)
*G01R 31/367* (2019.01)
(Continued)

(52) U.S. Cl.
CPC .......... *H01M 10/48* (2013.01); *G01R 31/367* (2019.01); *G01R 31/3842* (2019.01);
(Continued)

(58) Field of Classification Search
CPC .............. G01R 31/367; G01R 31/3842; G01R 31/389; G01R 31/392; H01M 10/052;
(Continued)

(56) References Cited

U.S. PATENT DOCUMENTS

2014/0329120 A1* 11/2014 Cui ..................... H01M 50/449
429/90

FOREIGN PATENT DOCUMENTS

| EP | 3151328 A1 | 4/2017 |
|---|---|---|
| WO | 2018045226 A1 | 3/2018 |
| WO | 2019241291 A1 | 12/2019 |

OTHER PUBLICATIONS

Armand, M. et al. "Building Better Batteries", Nature 2008, 451 (7179), 652-657 ("Armand 2008"), 6 pages.
(Continued)

*Primary Examiner* — Lingwen R Zeng
(74) *Attorney, Agent, or Firm* — Dickinson Wright PLLC; Ross Spencer Garsson

(57) ABSTRACT

Systems and methods that utilize a separator coated by particles for Li dendrite detection in an ordinary two-electrode battery system. The particles can be red phosphorus (RP) particles and/or other particles that are poor electronic conductors, are able to react with Li, and will form an insoluble product with Li, such as silicon, germanium, arsenic, metal oxides, metal halides, metal chalcogenides, chalcogenides, and $LiM_xE_yO_z$ (M=metal, E=nonmetal, O=oxygen, x≥0, y≥0, z≥0). These other particles can be used by themselves or in combination with one another. No additional electrode is needed, and the presence of Li (Continued)

dendrites can be detected simply based on the voltage profile during the charging step.

11 Claims, 44 Drawing Sheets

(51) Int. Cl.
| | |
|---|---|
| G01R 31/3842 | (2019.01) |
| G01R 31/392 | (2019.01) |
| H01M 4/38 | (2006.01) |
| H01M 10/0525 | (2010.01) |
| H01M 10/42 | (2006.01) |
| H01M 50/431 | (2021.01) |
| H01M 50/443 | (2021.01) |
| H01M 50/449 | (2021.01) |
| G01R 31/389 | (2019.01) |
| H01M 10/052 | (2010.01) |

(52) U.S. Cl.
CPC .......... *G01R 31/392* (2019.01); *H01M 4/382* (2013.01); *H01M 10/0525* (2013.01); *H01M 10/425* (2013.01); *H01M 50/431* (2021.01); *H01M 50/443* (2021.01); *H01M 50/449* (2021.01); *G01R 31/389* (2019.01); *H01M 10/052* (2013.01); *H01M 10/4235* (2013.01); *H01M 2010/4271* (2013.01); *Y02E 60/10* (2013.01)

(58) Field of Classification Search
CPC ......... H01M 10/0525; H01M 10/4235; H01M 10/425; H01M 10/48; H01M 2010/4271; H01M 4/382; H01M 50/431; H01M 50/443; H01M 50/449; Y02E 60/10
See application file for complete search history.

(56) References Cited

OTHER PUBLICATIONS

Bruce, P. et al. "Li—O2 and Li—S Batteries with High Energy Storage", Nat. Mater. 2011, 11 (2), 172-172 ("Bruce 2011"). 12 pages.
Burns, J., et al. "In-Situ Detection of Lithium Plating Using High Precision Coulometry", Journal of the Electrochemical Society, 162 (6) A959-A964 (2015); 6 pages.
Cano, Z., et al. "Batteries and fuel cells for emerging electric vehicle markets" Nat. Energy. 2018, 3, 279-289 ("Cano 2018"). 11 pages.
Cheng, X., et al., "Toward Safe Lithium Metal Anode in Rechargeable Batteries: A Review", Chem. Rev. 2017, 117, 10403-10473 ("Cheng 2018"). 71 pages.
Ding, F. et al. "Dendrite-Free Lithium Deposition via Self-Healing Electrostatic Shield Mechanism", J. Am. Chem. Soc. 2013, 135 (11), 4450-4456 ("Ding 2013"), 7 pages.
Dunn, B. et al. "Electrical Energy Storage for the Grid: A Battery of Choices". Science (80). 2011, 334 (6058), 928-935 ("Dunn 2011"), 9 pages.
Girishkumar, G. et al. "Lithium-Air Battery: Promise and Challenges". J. Phys. Chem. Lett. 2010, 1 (14), 2193-2203 ("Girishkumar 2010"); 11 pages.
Goodenough, J. et al., "The Li-Ion Rechargeable Battery: A Perspective". J. Am. Chem. Soc. 2013, 135 (4), 1167-1176 ("Goodenough 2013") 10 pages.
Harry, K., et al. "Influence of Electrolyte Modulus on the Local Current Density at a Dendrite Tip on a Lithium Metal Electrode". J. Electrochem. Soc. 2016, 163, A2216-A2224 ("Harry 2016"). 10 pages.
Li, L., et al. "Self-heating-induced healing of lithium dendrites". Science 2018, 359, 1513-1516 ("Li 2018"). 5 pages.
Li, W., et al. "Amorphous Red Phosphorus Embedded in Highly Ordered Mesoporous Carbon with Superior Lithium and Sodium Storage Capacity". Nano Lett. 2016, 16, 1546-1553 ("Li 2016"). 8 pages.
Lin, D. et al. "Layered Reduced Graphene Oxide with Nanoscale Interlayer Gaps as a Stable Host for Lithium Metal Anodes", Nat. Nanotechnol. 2016, 11, 626-632 ("Lin 2016"); 8 pages.
Lin, D., et al. "All-Integrated Bifunctional Separator for Li Dendrite Detection via Novel Solution Synthesis of a Thermostable Polyimide Separator". J. Am. Chem. Soc. 2016, 138, 11044-11050 ("Lin 2016"). 7 pages.
Liu, B., et al. "Advancing Lithium Metal Batteries". Joule 2018, 2, 833-845 ("Liu 2018"). 13 pages.
Liu, K., et al. "Extending the Life of Lithium-Based Rechargeable Batteries by Reaction of Lithium Dendrites with a Novel Silica Nanoparticle Sandwhiched Separator", Adv. Mater. 2017, 29, 1603987; 6 pages.
Liu, S.-Q. et al. "Kinetic study on Li2.8(Vo.9Geo.1)2(P04)3 by EIS measurement". J Alloys Compd 2008, 450, 499-504 ("Liu 2008"). 6 pages.
Manthiram, A. et al. "Lithium-Sulfur Batteries: Progress and Prospects". Adv. Mater. 2015, 27 (12), 1980-2006 ("Manthiram 2015"), 27 pages.
Mayo, M., et al. "Ab Initio Study of Phosphorus Anodes for Lithium- and Sodium-Ion Batteries". Chem. Mater. 2016, 28, 2011-2021 ("May 2016"). 11 pages.
Noorden, R. "The Rechargeable Revolution: A Better Battery". Nature 2014, 507, 26-28 ("Noorden 2014"), 3 pages.
Orsini, F., et al. "In situ SEM study of the interfaces in plastic lithium cells". J Power Sources. 1999, 81-82, 918-921 ("Orsini 1999"). 4 pages.
Qian, J. et al. "High Rate and Stable Cycling of Lithium Metal Anode". Nat. Commun. 2015, 6, 6362 ("Qian 2015"), 9 pages.
Raji, A., et al. "Lithium Batteries with Nearly Maximum Metal Storage". ACS Nano 2017, 11, 6362-6369 ("Raji 2017"). 8 pages.
Shen, X., et al. "Beyond lithium ion batteries: Higher energy density battery systems based on lithium metal anodes". Energy Storage Mater. 2018, 12, 161-175 ("Shen 2018"). 16 pages.
Wang, T. "Detecting Li Dendtrites in a Two-Electrode Battery System", Department of Chemistry, Rice University; 34 pages.
Wang, T. et al. "Detecting Li Dendtrites in a Two-Electrode Battery System", Department of Chemistry, Smalley-Curl Institute and the NanoCarbon Center, Department of Materials Science and NanoEngineering, Rice University; 20 pages.
Wang, T. et al. "Detecting Li Dendtrites in a Two-Electrode Battery System-Supplementary Information", Department of Chemistry, Smalley-Curl Institute and the NanoCarbon Center, Department of Materials Science and NanoEngineering, Rice University; 17 pages.
Wang, T., et al. "Ultrafast Charging High Capacity Asphalt-Lithium Metal Batteries". ACS Nano 2017, 11, 10761-10767 ("Wang 2017"). 7 pages.
Wood, K., et al. "Dendrites and Pits: Untangling the Complex Behavior of Lithium Metal Anodes through Operando Video Microscopy". ACS Cent. Sci. 2016, 2, 790-801 ("Wood 2016"). 12 pages.
Wu, H., et al. "Improving Battery Safety by Early Detection of Internal Shorting With a Bifunctional Separator". Nat. Commun. 2014, 5, 5193-5198 ("Wu 2016"). 6 pages.
Xu, W. et al. "Lithium Metal Anodes for Rechargeable Batteries", Energy Environ. Sci. 2014, 7 (2), 513-537 ("Xu 2014"); 25 pages.
Zhang, J. et al. "Lithium Metal Anodes and Rechargeable Lithium Metal Batteries", 1st ed.; Hull, R. et al., Eds.; Springer International Publishing, 2017 ("J. Zhang 2017"); 206 pages.
Zhang, S., et al. "Electrochemical impedance study on the low temperature of Li-ion batteries". Electrochimi. Acta 2004, 49, 1057-1061 ("Zhang 2004"). 5 pages.
International Searching Authority, International Search Report and Written Opinion; PCT/US2019/036609; date of mailing Nov. 15, 2019; 23 pages.

\* cited by examiner

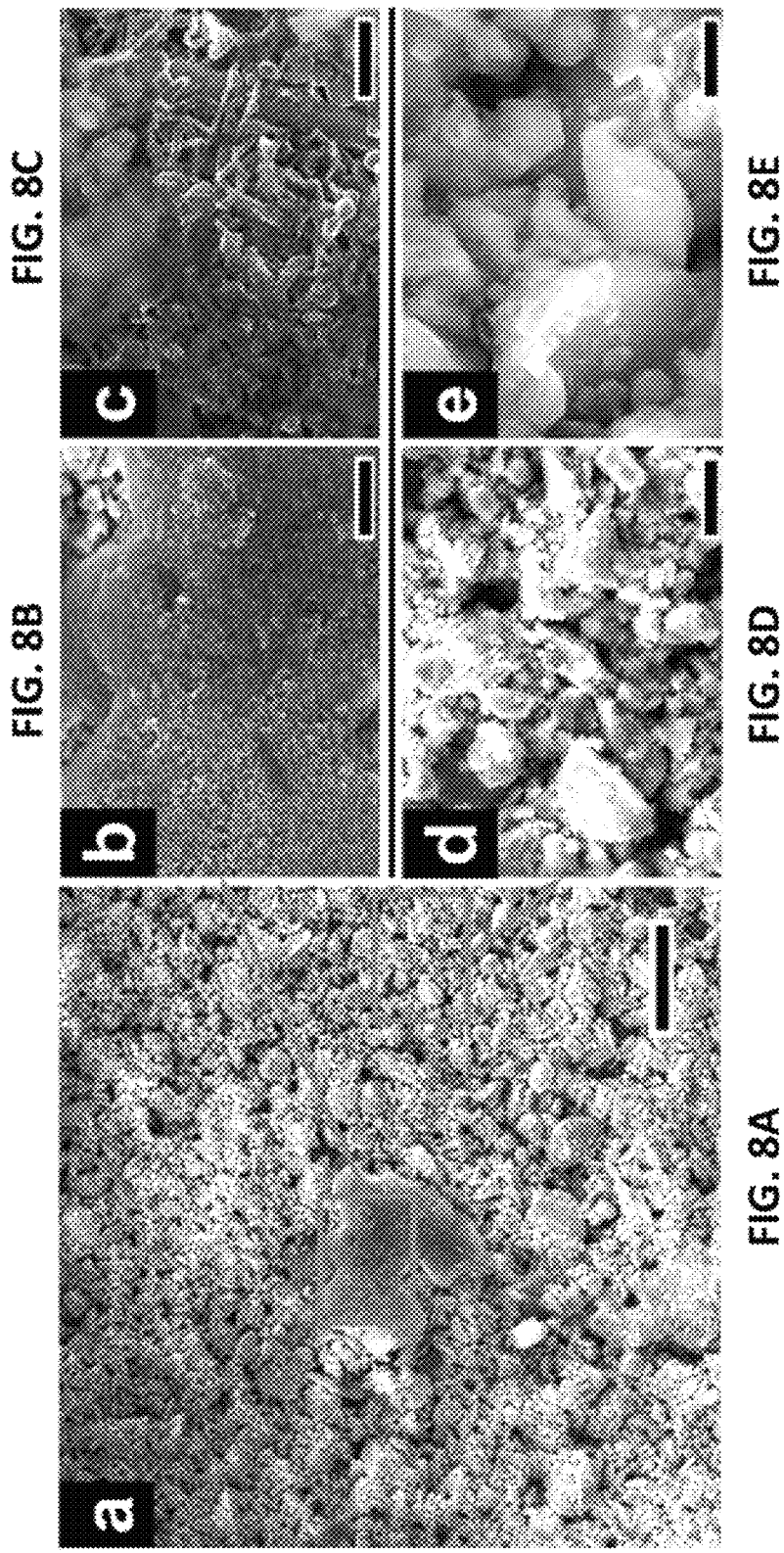

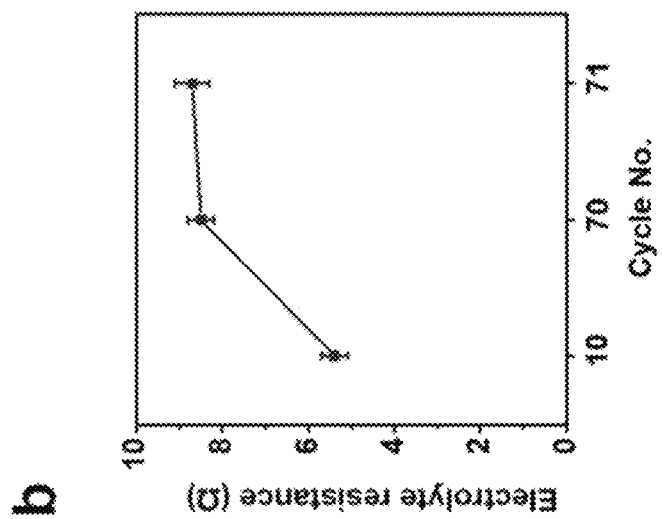
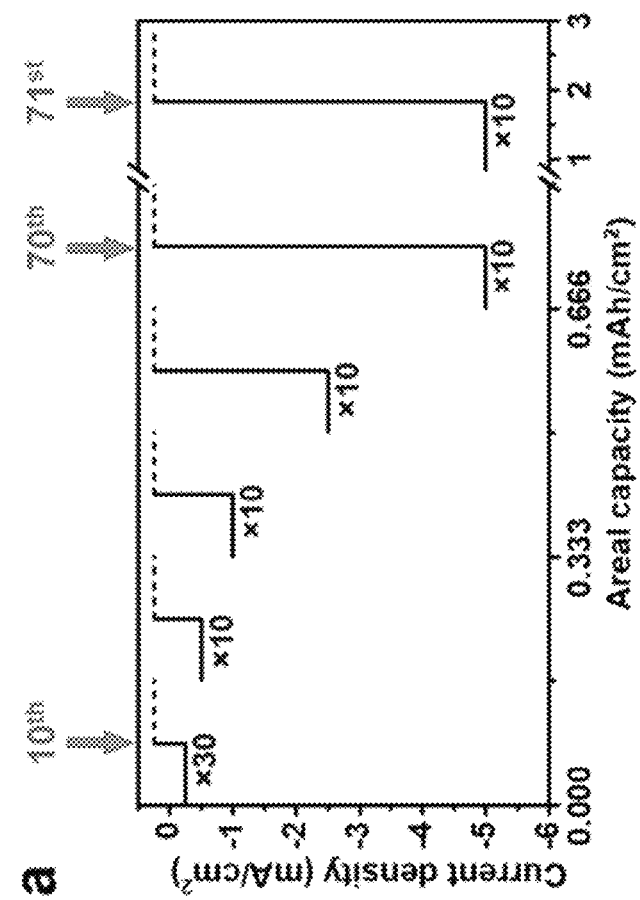
FIG. 15B
FIG. 15A

SYSTEMS AND METHODS OF DETECTING LI DENDRITES

CROSS-REFERENCE TO RELATED PATENT APPLICATIONS

This application is a 35 U.S.C § 371 national application of PCT Application No. PCT/US19/36609, filed on Jun. 11, 2019, entitled "Systems And Methods Of Detecting Li Dendrites", which claims priority to U.S. Patent Appl. Ser. No. 62/683,158, entitled "Systems and Methods Of Detecting Li Dendrites," filed Jun. 11, 2018, and to U.S. Patent Appl. Ser. No. 62/720,033, entitled "Systems and Methods Of Detecting Li Dendrites," filed Aug. 20, 2018, which patent applications are commonly owned by the owner of the present invention. These patent applications are incorporated herein in their entirety.

GOVERNMENT INTEREST

This invention was made with government support under Grant Nos. FA9550-14-1-0111 awarded by the Air Force Office of Scientific Research. The United States government has certain rights in the invention.

TECHNICAL FIELD

The present invention relates to systems and methods for detecting Li dendrites, and more particularly, systems and methods for detecting Li dendrites in a two-electrode system.

BACKGROUND

Lithium-ion batteries are today's energy storage device technology of choice for electronic devices and electric vehicles. Since its commercialization in 1991, the lithium-ion battery (LIB) enabled wireless electronic devices, revolutionizing global communications. Almost three decades later, the LIB is expected to facilitate the integration of renewable energy into the electrical grid, as well as to allow affordable electric transportation. [Goodenough 2013; Noorden 2014; Dunn 2011; Zhang 2017]. However, these applications demand energy storage capabilities that the LIBs will be unable to meet, even if the theoretical energy density is reached. Therefore, new battery chemistries with higher energy densities have attracted the attention of the scientific community. There are new efforts to develop new battery chemistries with higher energy densities, such as lithium-air (Li—$O_2$) and lithium-sulfur (Li—S), while also resolving the current limitations with pure lithium, commonly called lithium metal anodes. Li-air (Li—$O_2$) and Li-sulfur (Li—S) systems have shown great promise as the energy densities are almost one order of magnitude higher than that of the LIB. [Noorden 2014; Bruce 2011; Girishkumar 2010; Manthiram 2015; Armand 2008].

The use of high-energy density Li metal anodes in rechargeable batteries is prohibited because of dendrite formation that could potentially result in a battery fire. Although so-called dendrite-free Li metal anodes are reported in many recent publications, Li dendrite growth is still kinetically favorable and it remains a severe safety concern upon mass production. We report here a detection system capable of alerting for Li dendrite formation in a two-electrode battery with no additional electrodes required. When dendrites contact a red phosphorous-coated separator, dendrite growth is revealed by a significant voltage change. This could activate a signal through the battery management system, warning of the presence of Li dendrites and leading to shutdown of the battery before the dendrites become dangerous.

Li metal batteries are considered the next-generation technology because of their high energy density and power density. [Cano 2018; Liu 2018]. But commercially, Li metal has only been employed in non-rechargeable primary batteries due to the safety issues associated with dendrite growth upon charging [Liu 2018; Shen 2018] that can penetrate separators and lead to runaways, fires and explosions. [Xu 2014; Orsini 1999]. There have been very few studies on Li dendrite detection, and the only known method is to use a Cu film in the separator connected to a third electrode to detect short circuits. [Wu 2014; Lin 2016]. The added manufacturing complexity of three-electrode batteries retards such a consideration for large-scale use.

But, commercially, Li metal has only been employed in primary batteries that cannot be recharged due to the safety issue associated with "dendrite" growth. When Li metal is regenerated in the charging step, it tends to form whisker and needle-like dendritic structures, often called "dendrites." These dendrites can penetrate separators and eventually short the batteries, which could lead to fires or explosions. This is a main challenge for Li metal batteries.

Accordingly, tremendous efforts have been made to develop dendrite-free Li metal anodes by using host materials or constructing artificial solid-electrolyte interface (SEI) layers to suppress dendrite growth. But those materials were only studied on the bench scale, and the number of batteries that have been tested was very limited. When it comes to the mass production of batteries on the industrial level, the number of batteries could reach a billion or even more, and it is nearly impossible to ensure that every single one of them is dendrite-free. However, if an insurance system can be developed in combination with dendrite-free Li metal anodes where the chance of growing dendrite is exceedingly low already, then the practical application of Li metal batteries may become reality. That insurance system would act as a sensor and be able to detect Li dendrite formation when the battery is being used, such that it can send a signal to the battery management system, warning of the presence of Li dendrites, which leads to shutdown of the battery before the dendrites have progressed to the cathode causing an internal short circuit with a possible battery fire resulting.

Dendrite-free Li metal anodes were developed by adding host materials, constructing supplemental solid-electrolyte interphase (SEI) layers, and modifying the electrolytes or separators to suppress dendrite growth. [Liu 2018; Cheng 2017; Wang 2017; Raji 2017; Lin II 2016; Liu 2017] These studies were conducted on the bench scale with a limited number of batteries tested. Since mass production of batteries on the industrial level could reach billions, it is nearly impossible to ensure that all would operate dendrite-free. However, if a detection system could be deployed in combination with so-called dendrite-free Li metal anodes where the chance of growing dendrites is already low, the large-scale production of safe, rechargeable Li metal batteries can become a reality.

Accordingly, there is a need for an improved method for detecting Li dendrites.

SUMMARY OF THE INVENTION

The present invention is directed to systems and methods that utilize a separator coated by particles for Li dendrite detection in an ordinary two-electrode battery system. The particles can be red phosphorus (RP) particles and/or other particles that are poor electronic conductors, are able to react with Li, and will form an insoluble product with Li, such as silicon, germanium, arsenic, metal oxides, metal halides, metal chalcogenides, chalcogenides, and $LiM_xE_yO_z$ (M=metal, E=nonmetal, O=oxygen, $x \geq 0$, $y \geq 0$, $z \geq 0$). These other particles can be used by themselves or in combination with one another. No additional electrode is needed, and the presence of Li dendrites can be detected simply based on the voltage profile during the charging step. For embodiments that utilize RP as the main ingredient, RP is inexpensive and the preparation of the RP-coated separators is facile and scalable. The present invention makes it much more convenient to produce and safely operate Li metal batteries.

In general, in one embodiment, the invention features a structure in a metal-anode-based battery that includes an anode that includes a metal, a cathode, and an electrodeless separator positioned between the anode and the cathode. A detectable electrical response signal will result during a charging or discharging of the battery when the metal from the metal anode contacts the electrodeless separator.

Implementations of the invention can include one or more of the following features:

The metal that contacts the electrodeless separator can extend from the anode.

The metal can be selected from a group consisting of lithium, sodium, potassium, magnesium, calcium, aluminum, zinc, cesium, mixtures thereof, and composites therefrom.

The electrodeless separator can have a conductivity of at most $10^{-5}$ S/cm.

The electrodeless separator can include red phosphorous.

The electrodeless separator can include a material selected from a group consisting of red phosphorous, silicon, germanium, arsenic, metal oxides, metal halides, metal chalcogenides, chalcogenides, LiMxEyOz with M=metal, E=nonmetal, O=oxygen, $x \geq 0$, $y \geq 0$, and $z \geq 0$, MXenes, 2D materials, polymers, organic polymers, inorganic polymers, and mixtures thereof or composites therefrom.

The material can be a poor electronic conductor, is able to react with Li, and will form an insoluble product with Li when reacted with Li.

The electrodeless separator can be independent of all other films.

The electrodeless separator can be deposited upon or within another film or matrix host material.

In general, in another embodiment, the invention features an electronic system that includes a battery management system having the above-described structure. The electronic system is operable to signal a turnoff or cessation of battery use in response to the detectable electrical response signal resulting from the metal from the metal anode contacting the electrodeless separator in the above-described structure.

Implementations of the invention can include one or more of the following features:

The detectable electrical response signal generated can be a change in voltage with respect to time during the charging of the battery.

The change in voltage can be least 0.25 V.

In the structure, the voltage will decrease by at most 0.1 V if the battery rests for at least 1 hour after the voltage increases at least 1 V.

The change in voltage can be least 1 V.

In general, in another embodiment, the invention features an energy-storage device that includes an anode including a metal. The energy-storage device further includes a cathode. The energy-storage device further includes an electrolyte containing cations of the metal. The electrolyte is disposed between the anode and the cathode. The energy-storage device further includes an electrodeless reagent partition in the electrolyte between the anode and the cathode. The electrodeless reagent partition includes a reagent that can react chemically with the metal.

Implementations of the invention can include one or more of the following features:

The reagent can react with a morphological feature of the metal extending from the anode.

The metal can include lithium.

The reagent can include phosphorous.

The reagent can include red phosphorous.

The reagent can include particles.

The reagent can include at least one material selected from a group consisting of silicon, germanium, arsenic, metal oxides, metal fluorides, and LiMxEyOz with M=metal, E=nonmetal, O=oxygen, and $x \geq 0$, $y \geq 0$, and $z \geq 0$.

The energy-storage device can further include a separator extending through the electrolyte between the reagent partition and the anode.

The reagent partition can be disposed on the separator.

The energy-storage device can further include a separator extending through the electrolyte between the reagent partition and the cathode.

The reagent can be an electrical insulator.

The reagent can have a conductivity of less than $10^{-5}$ S/cm.

The electrolyte can be a liquid.

The cathode can include a conductive reagent that reacts chemically with the cations of the metal.

The electrodeless reagent partition can be of a thickness less than one millimeter.

The electrodeless reagent partition can include multiple separator layers.

The electrodeless reagent partition can be essentially red phosphorus.

The electrodeless reagent partition can include a separator layer coated with the reagent.

The reagent can be prepared by a process that includes coating the separator with a slurry.

The reagent can be applied to the separator layer by a process that includes coating the separator by vacuum filtration.

In general, in another embodiment, the invention features a test method for dendrite detection in an energy-storage device having a first electrode and a second electrode. The test method includes measuring charge timing of the energy-storage device. The test method further includes storing a charging model of the measured charge timing of the energy-storage device, the charging model providing an expected charge timing. The test method further includes charging the energy-storage device while monitoring a charging time and a charging voltage between the first electrode and the second electrode. The test method further includes issuing a dendrite-detection signal if the charging voltage reaches a threshold voltage before the expected charge timing.

Implementations of the invention can include one or more of the following features:

The expected charge timing can include an expected full-charge timing.

The dendrite-detection signal can be a tentative signal. The method can further include adjusting a charging current responsive to the dendrite-detection signal to limit the charging voltage.

The adjusting of the charging current can limit the charging voltage.

The test method can further include issuing an affirmative dendrite-detection signal if the charging current falls while the device is charged at the charging voltage.

The test method can further include issuing the affirmative dendrite-detection signal if the charging current falls for at least ten seconds while the device is charged at the charging voltage.

The energy-storage device can include a lithium-metal battery.

The charging the energy-storage device can include maintaining the charging current at at least 2.5 mA/cm$^2$.

The dendrite-detection signal can be a tentative signal. The method can further include continuing to charge the energy-storage device after the issuing of the tentative signal for a dendrite-verification period.

The test method can further include disabling the energy-storage device if the energy-storage device is charged at at least the threshold voltage after the dendrite-verification period.

The dendrite-verification period can be at least ten seconds.

The expected charge timing and the measured charge timing can be equal.

In general, in another embodiment, the invention features Implementations of the invention can include one or more of the following features:

In general, in another embodiment, the invention features a battery-management system that executes one or more of the above-described methods to test a battery. The battery includes an anode that includes a metal. The battery further includes a cathode. The battery further includes an electrolyte containing cations of the metal. The electrolyte is disposed between the anode and the cathode. The battery further includes an electrodeless reagent partition in the electrolyte between the anode and the cathode. The electrodeless reagent partition includes a reagent that can react chemically with the metal.

In general, in another embodiment, the invention features a test method for dendrite detection in an energy-storage device having a first electrode and a second electrode. The test method includes storing a charging model of the energy-storage device with the charging model providing an expected charge voltage. The test method further includes charging the energy-storage device while monitoring a charging voltage between the first electrode and the second electrode. The test method further includes issuing a dendrite-detection signal if the charging voltage exceeds the expected charge voltage.

Implementations of the invention can include one or more of the following features:

The test method can further include issuing the dendrite-detection signal if the charging voltage exceeds the expected charge voltage by at least 0.25 V.

The test method can further include issuing the dendrite-detection signal if the charging voltage exceeds the expected charge voltage by at least 1.0 V.

The test method can further include allowing the charging voltage to exceed the expected charge voltage by a voltage margin. The test method can further include storing a measure of the charging voltage. The test method can further include allowing the device to rest for a rest period. The test method can further include measuring a test voltage between the first electrode and the second electrode after the rest period. The test method can further include affirming the dendrite-detection signal if the test voltage falls below a detection level during the rest period.

The voltage margin can be at least one volt.

The rest period can be at least one hour.

The detection level can be at least 0.1 V below the measured charging voltage.

DESCRIPTION OF DRAWINGS

FIG. 1A is a configuration of the half-cell with RP coating (P-hc). FIG. 1B is a testing protocol showing the current density versus time. (The discharge steps were time-control (20/10/5/2/1 min at ~0.083 mAh/cm$^2$ and 12 min at ~1 mAh/cm$^2$); the charge steps were voltage-control (2 V) and are thus shown as dashed lines because the areal capacities (<0.083 mAh/cm$^2$) varied. The discharge steps were time-control (20/10/5/2/1 min at ~0.083 mAh/cm$^2$ and 12 min at ~1 mAh/cm$^2$); the charge steps were voltage-control (2 V) and are thus shown as dashed lines because the areal capacities (<0.083 mAh/cm$^2$) varied.) FIG. 1C is the voltage profile at low areal capacity (~0.083 mAh/cm$^2$). FIG. 1D is the voltage profile at 5 mA/cm$^2$ and high areal capacity (~1 mAh/cm$^2$). The voltage decrease indicated by the arrow in FIG. 1D is the electrochemical response generated when Li dendrite contacts the RP coating. FIGS. 1E-1G are photographs of the RP-coated separator at different stages showing (in FIG. 1E) no silver-colored Li metal and (in FIGS. 1F-1G) Li metal on the RP. FIG. 1H is the XRD spectrum of the silver-colored spots in FIG. 1G. FIGS. 1I-1J are SEM images of the silver-colored spots in FIG. 1G showing the dendritic morphology of Li. Scale bars for FIGS. 1I-1J are 100 μm and 2 μm, respectively.

FIG. 3A shows a configuration of the transparent half-cell with a RP-coated separator. FIG. 3B is a graph that shows voltage and current profiles of transparent half-cells with and without the RP-coated separator when discharging the Li metal wrapped by the separator. FIG. 3C are a series of photographs (top view) of the discharged Li metal surface taken over time. FIG. 3D is an enlarged photographic image of the area indicated in the photograph taken at 15 minutes. The scale bars for FIGS. 3C-3D are 1 mm and 0.2 mm, respectively.

FIG. 4A is the configuration of ctrl-1. FIG. 4B is the voltage profile of ctrl-1 at low areal capacity (~0.083 mAh/cm$^2$). FIG. 4C is the voltage profile of ctrl-1 at 5 mA/cm$^2$ and high areal capacity (~1 mAh/cm$^2$). FIG. 4D is the configuration of ctrl-2. FIG. 4E is the voltage profile of ctrl-2 at low areal capacity (~0.083 mAh/cm$^2$). FIG. 4F is the voltage profile of ctrl-2 at 5 mA/cm$^2$ and high areal capacity (~1 mAh/cm$^2$).

FIGS. 8A-8E are SEM images of the silver-colored spots shown in FIG. 1G. FIGS. 8B-8C show the dendritic morphology of Li in FIG. 8A. FIGS. 8D-8E show the RP particles around the Li dendrites in FIG. 8A.

FIGS. 8F-8I are (i) 100 μm, (ii) 20 μm, (iii) 2 μm, and (iv) 50 μm, respectively.

FIG. 9A shows a configuration of the full-cell with a RP coating (P-fc). FIG. 9B is a graph showing a voltage profile of P-fc shown in FIG. 9A at 5 mA/cm$^2$ and ~0.8 mAh/cm$^2$. FIG. 9C shows the configuration of ctrl-3, which includes all separators without any RP coating. FIG. 9D is a graph showing the voltage profile of ctrl-3 shown in FIG. 9C at 5 mA/cm$^2$ and ~1 mAh/cm$^2$.

FIG. 14A is a graph showing a voltage profile of P-hc (shown in FIG. 1A) tested at 5 mA/cm$^2$. FIG. 14B is a graph showing a voltage profile of ctrl-1 (shown in FIG. 4A) tested at 5 mA/cm$^2$. FIG. 14C is a graph showing a comparison of the charge transfer resistance of P-hc and ctrl-1. FIG. 14D is a graph showing P-hc tested at different current densities (unit: mA/cm$^2$). FIG. 14E shows the mechanism of dendrite detection: schematic illustration of Li dendrite growth at 5 mA/cm$^2$ under low and high capacities in P-hc.

FIGS. 15A-15D shows a study on electrolyte resistance in half-cells (P-hc). FIG. 15A is a graph showing the testing. FIG. 15B is a graph showing the electrolyte resistance of the P-hc. FIGS. 15C-15D are graphs showing particular voltage profiles.

DETAILED DESCRIPTION

Described are systems and methods that utilize a separator coated by particles for Li dendrite detection in an ordinary two-electrode battery system. A reagent that reacts with Li metal is layered on the separator of a Li cell to form a reagent partition between the Li anode and the cathode. The reagent is of a material that is inert to Li cations in the electrolyte but reacts chemically with metallic Li. Suitable reagent materials in some embodiments are poor electronic conductors, are able to react with Li, and will form an insoluble product with Li, such as red phosphorus (RP) particles and/or other particles, such as silicon, germanium, arsenic, metal oxides, metal halides, metal chalcogenides, chalcogenides, and LiMxEyOz (M=metal, E=nonmetal, O=oxygen, x≥0, y≥0, z≥0). Physical isolation prevents the reagent from reacting with Li metal during normal operation. Such reaction does occur, however, if Li dendrites extend to the reagent partition. Dendrites combine with the reagent partition to create dendritic structures that change a cell's voltage response to charging current. Cells equipped with reagent partitions can thus be stimulated to produce a dendrite-detection signal without the need for a third electrode. Electrodeless reagent partitions thus facilitate dendrite detection in two-terminal cells.

The particle-coated separator can be an RP-coated separator, which will be used herein for exemplary purposes. Other materials as discussed above can be utilized in addition and/or in lieu of RP.

The separator, such as the RP-coated separator, is used to detect the growth of morphological features, such as dendrites, in accordance with one embodiment. The coating can be 90 wt % RP and 10 wt % polyvinyl difluoride (PVDF) as the binder that ensures the uniformity of the coating. The mass loading of RP can be around 2 mg/cm$^2$ or greater. The RP-coated separator can be physically separated from the anode and the cathode, as side reactions could occur between RP and the anode/cathode materials. If not separated, RP could be directly lithiated. When Li dendrites grow long enough to reach the RP coating, there will be a noticeable electrochemical response in the voltage profile with respect to time. The voltage decreases in half-cells or increases in full-cells when Li dendrites reach the RP separator. Changes in cell voltage can thus alert the user (or battery management system) of Li dendrite formation.

RP-Coated Separators in Half-Cells

Figure 1A:
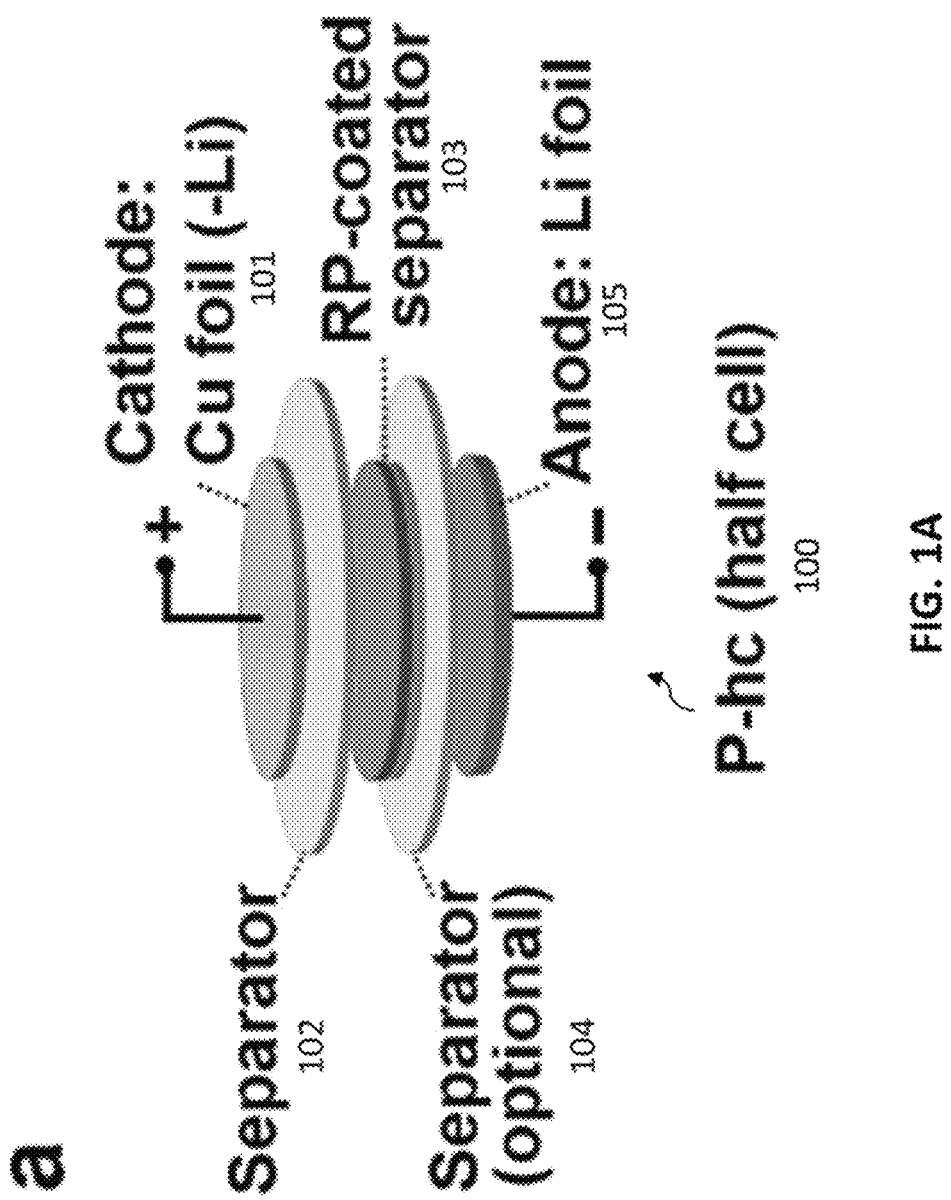
FIGS. 1A-1J show half-cell tests with red P (RP) coating on a separator (P-hc).

The configuration of a half-cell (P-hc) 100 is shown in FIG. 1A. Li foils were used as the anode 105 and Cu foils were used as the current collector for the cathode 101 where Li metal was electrochemically deposited in the discharge process. An RP-coated separator 103 is located between the cathode 101 and anode. Additional separators 102 and 104 can also be positioned between the RP-coated separator and the cathode 101 and anode 105, respectively. Separator 104 is optional since the separator that RP was coated on was enough to isolate the RP layer from the anode. However, separator 104 can be added to ensure that the RP on the edge did not contact anode 105.

The RP-coated separator can be prepared by adding RP (MilliporeSigma) or a mixture of RP and graphene nanoplatelets (GNP) (xGnP® C-300 from XG Sciences) to a mortar and adding polyvinyl difluoride (PVDF) (Alfa Aesar) as a binder. Generally, the coating can be around 90 wt % RP (or RP-GNP) and around 10 wt % of the binder to ensure uniformity of the coating. For instance, the RP (or RP/GNP mixture) can be around 32 mg and the binder is around 3.5 mg. The slurry can then be prepared by adding NMP (MilliporeSigma) (such as 0.5-0.8 mL of NMP), and the mixture was ground (such as for 5 min) to form a slurry that was then coated on the separators using a spatula. Such separators can be, for example, Celgard 2500 polypropylene separators (20 μm thick, around 2 cm² each) or Targray SW312D separators (which are 12 μm-thick polyethylene membranes). The separators can then be dried, such as by drying under vacuum (~1 Torr) at 60° C. overnight. A similar slurry process can be utilized to make separators coated with GNP. By the above amounts, the mass loading of RP, GNP or RP/GNP was about 2 mg/cm².

Such coated separators can also be made using alternative methods, such as a vacuum filtration method that coats the RP, RP/GNP, or GNP on the non-electrode side of the separators.

Dendrite Detection Using RP-Coated Separators in Half-Cells

Figure 2:
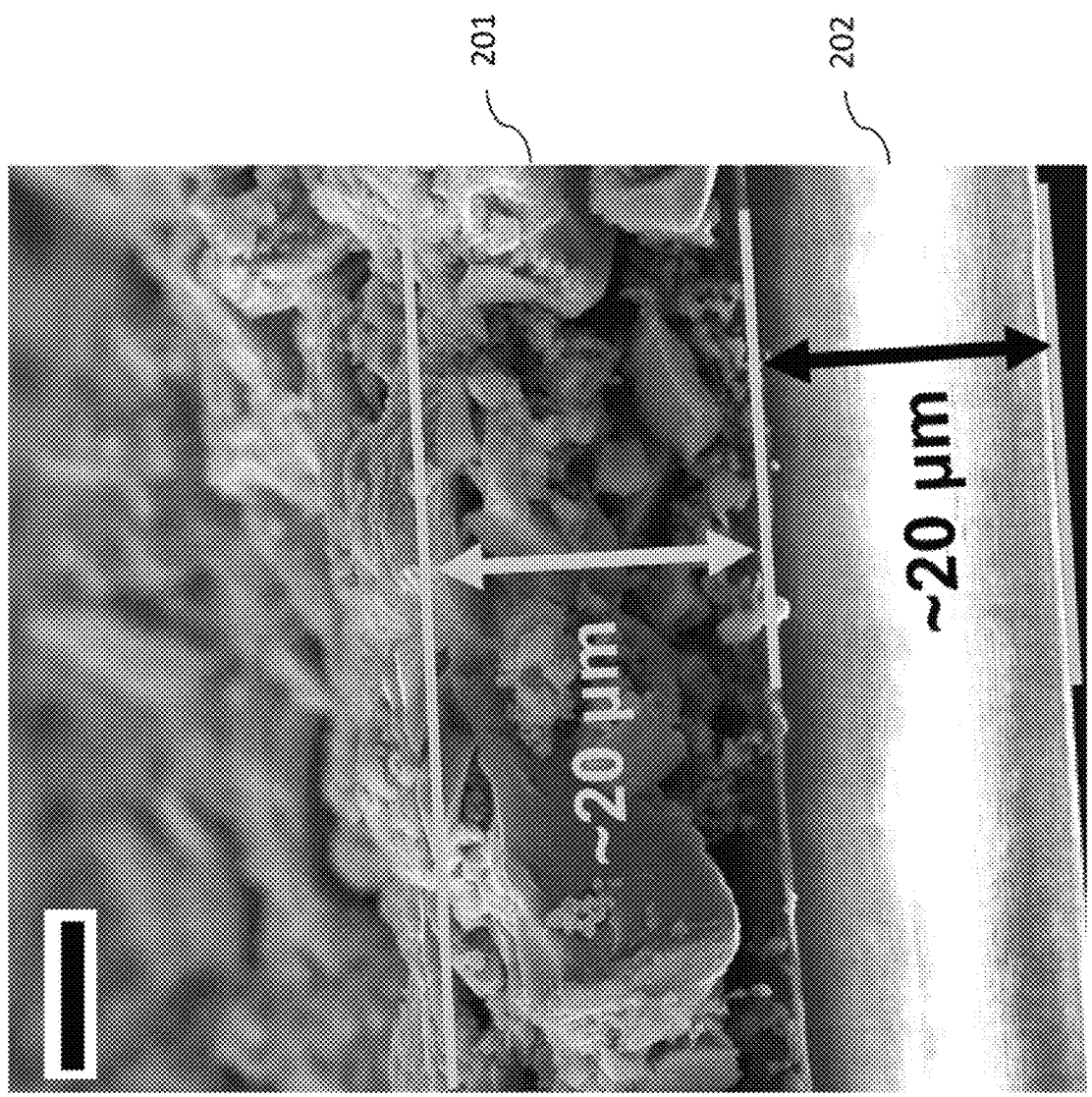
FIG. 2 is an SEM image of a cross-section of a RP-coated separator. The scale bar is 10 μm.

Half-cell tests were performed to demonstrate the operation of the RP-coated separator. The RP-coated separator was prepared utilizing the slurry method described above. The RP-coated separator was around 20 μm thick with around 2 mg/cm² of RP (see FIG. 2), while the RP layer of the RP-coated separator 103 was physically isolated from the anode 105 and the cathode 101, with the separator 104 again being optional). (For the testing, the two separators used in half-cells (and for the full-cells) were each 12 μm thick, thereby reducing the thickness of the entire separator/RP/separator stack to ~45 μm). LiPF6 was selected as the electrolyte in testing since it is known to produce dendrites faster than other common electrolytes. [Ding 2013]. In FIG. 2, layer 201 is around 20 μm thick RP layer on a separator 202 that is around 20 μm.

Figure 1B:
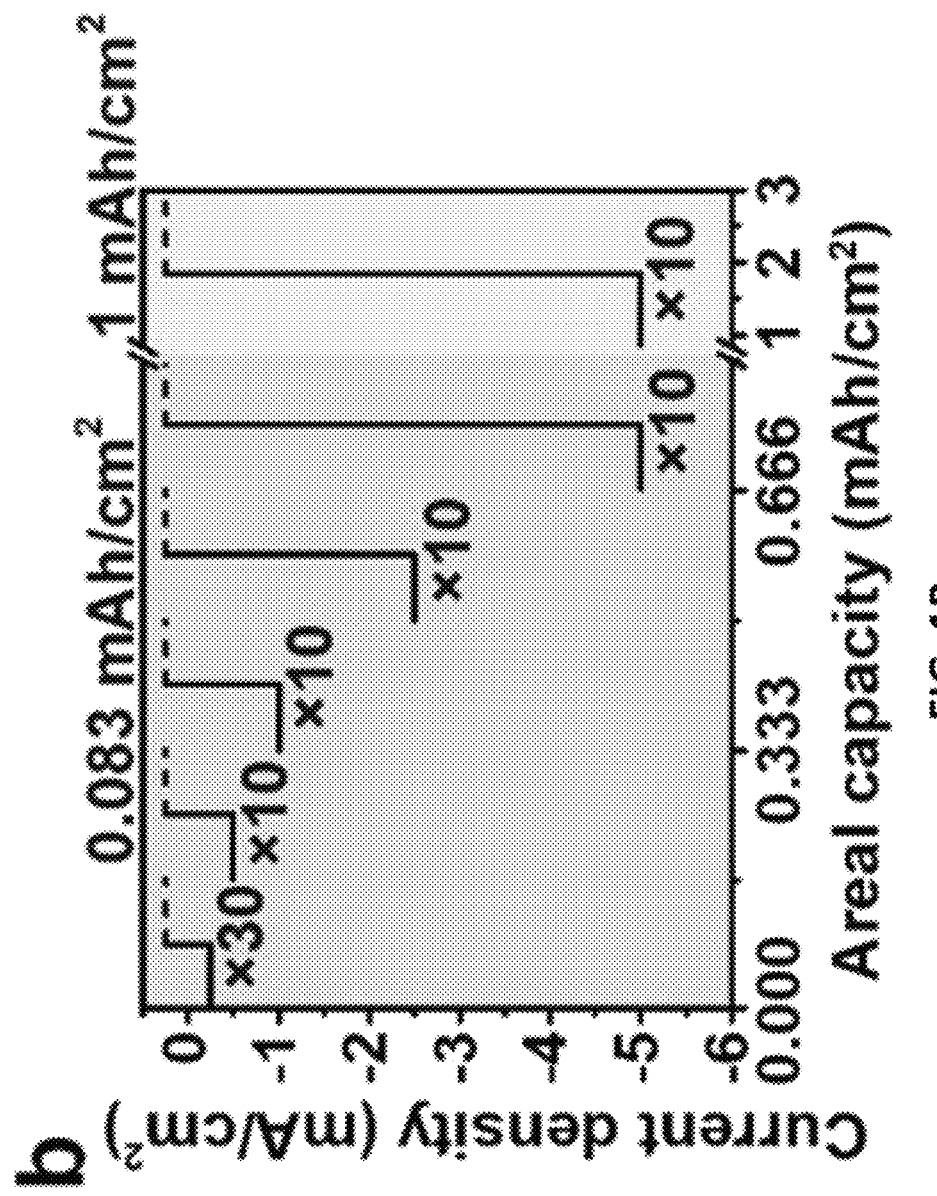
Figure 1C:
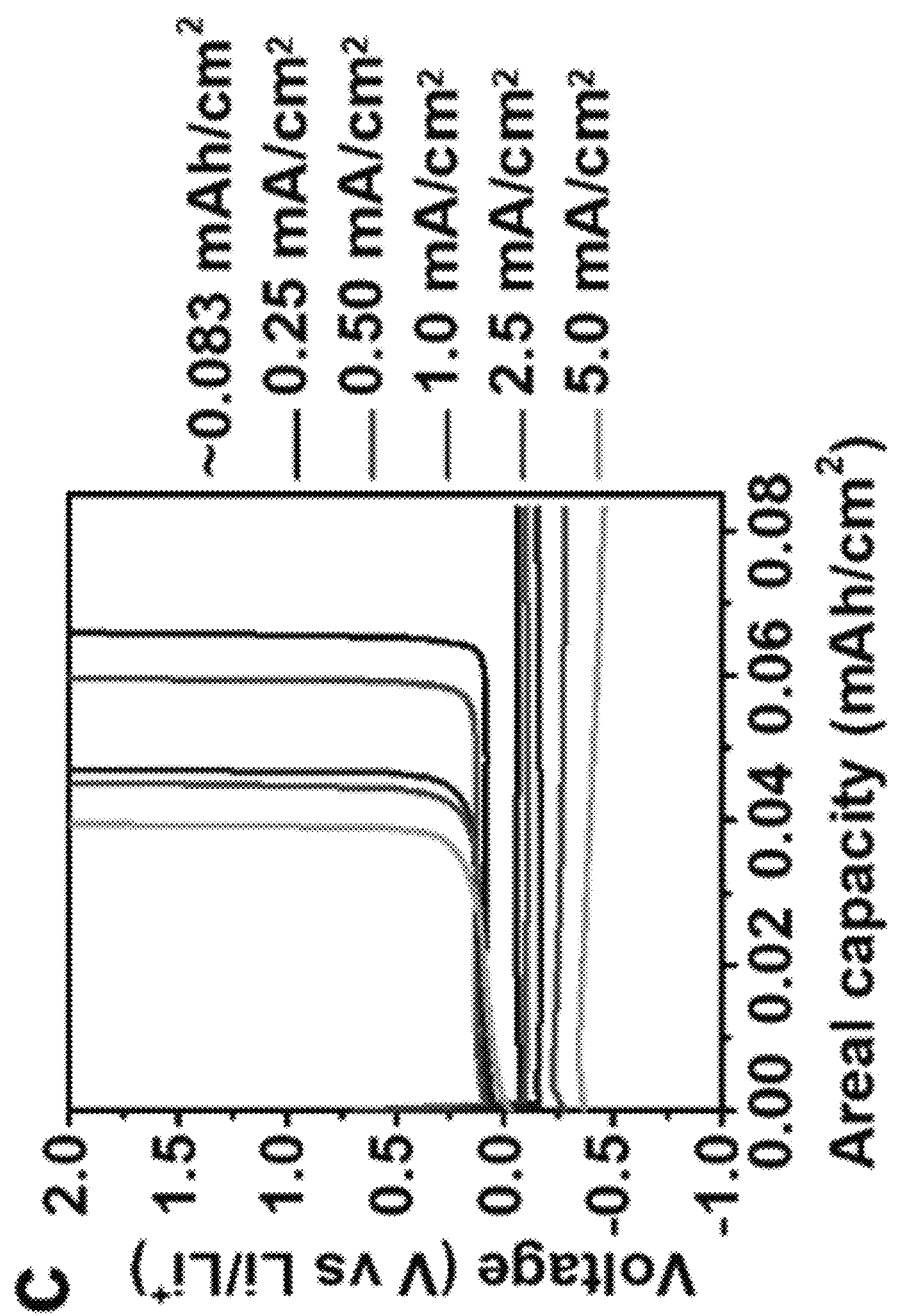

A special testing protocol was developed (shown in FIG. 1B) to induce dendrite growth and demonstrate the dendrite-detection response. The half-cell was first cycled at 0.25 mA/cm² under a low capacity (~0.083 mAh/cm²) until the coulombic efficiency (CE) stabilized to minimize the effects of irreversible side reactions. [Wang 2017; Raji 2017]. The discharge rate was increased progressively to 0.50/1.0/2.5/5.0 mA/cm². The above steps accelerate the aging of the cathode that benefits dendrite growth. The charge rate remained at 0.25 mA/cm² to ensure complete removal of Li from the cathode and negligible dendrite growth on the anode, which simplified the analysis. In the initial 70 cycles at low capacity (0.083 mAh/cm²), the stable charge and discharge plateaus in FIG. 1C verified that the half-cell was functioning normally. Higher discharge rates led to lower CE and hence more SEI or dendrite formation (FIG. 1C), but the low capacity ensured that the dendrites did not extend to the RP-coated separator and stable discharge plateaus were always present.

Figure 1D:
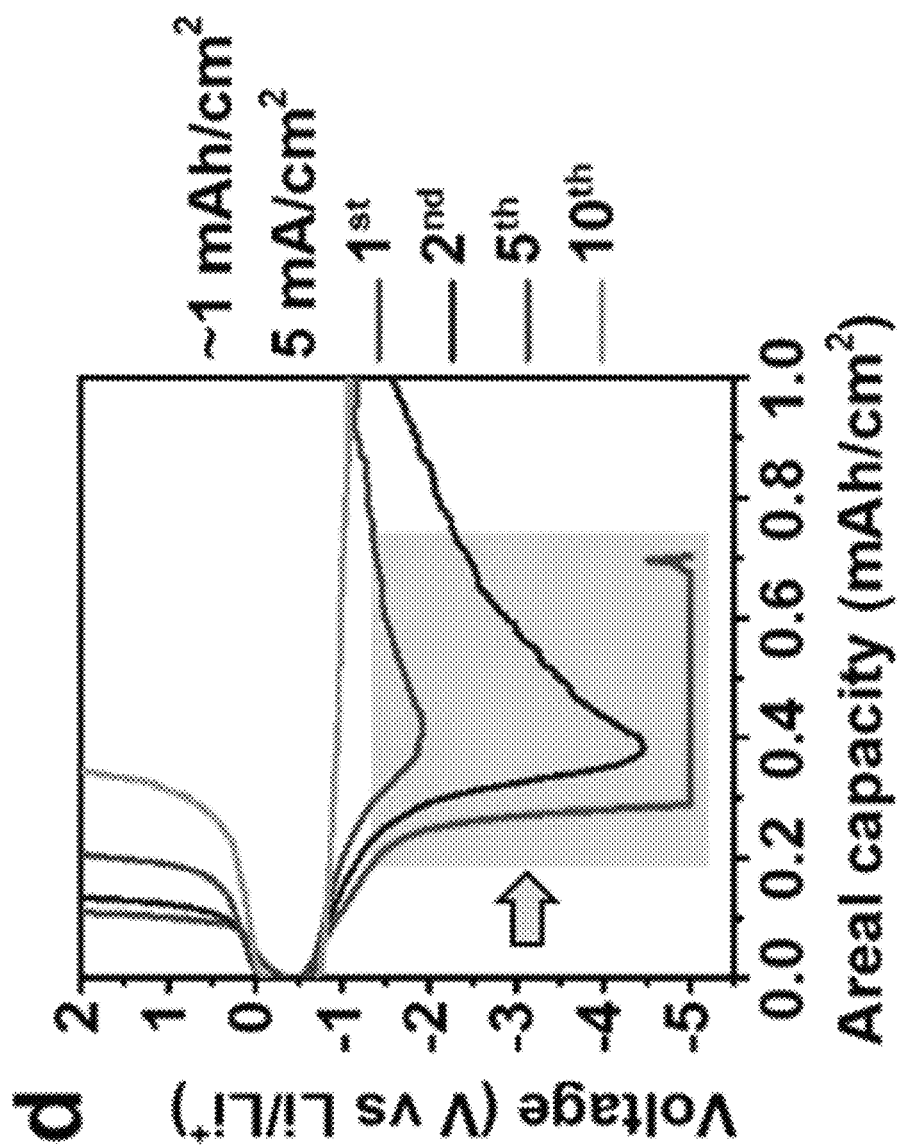
Figures 1E, 1F, 1G:
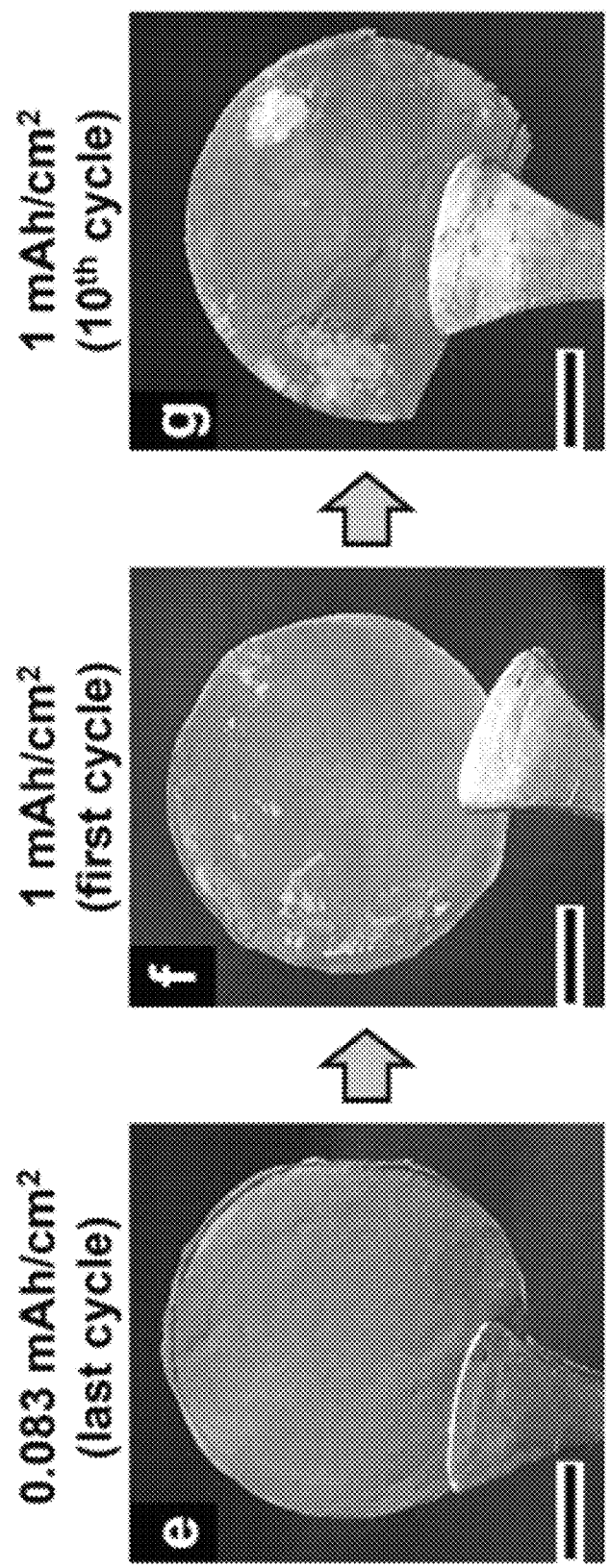
Figure 4A:
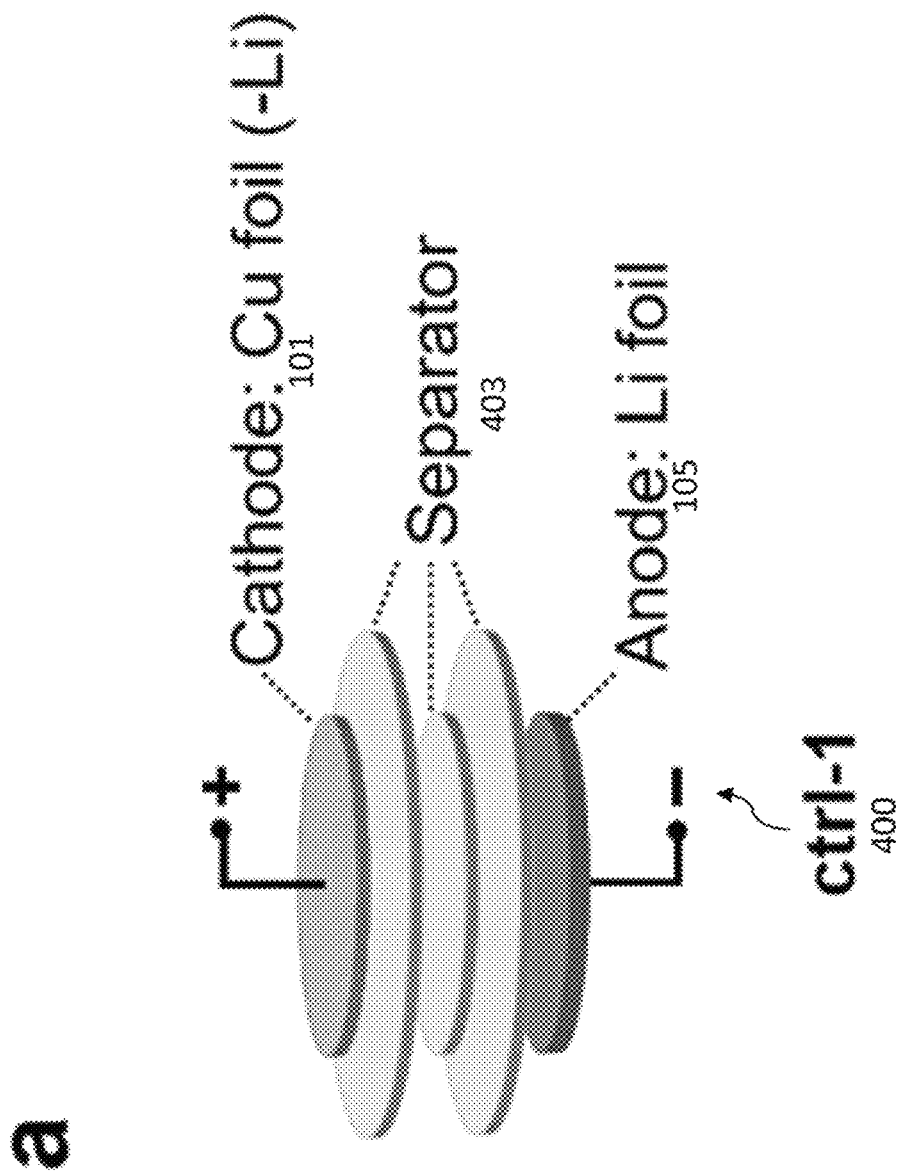
FIGS. 4A-4F show half-cell tests without the RP coating on the middle separator (ctrl-1 and ctrl-2).
Figure 4B:
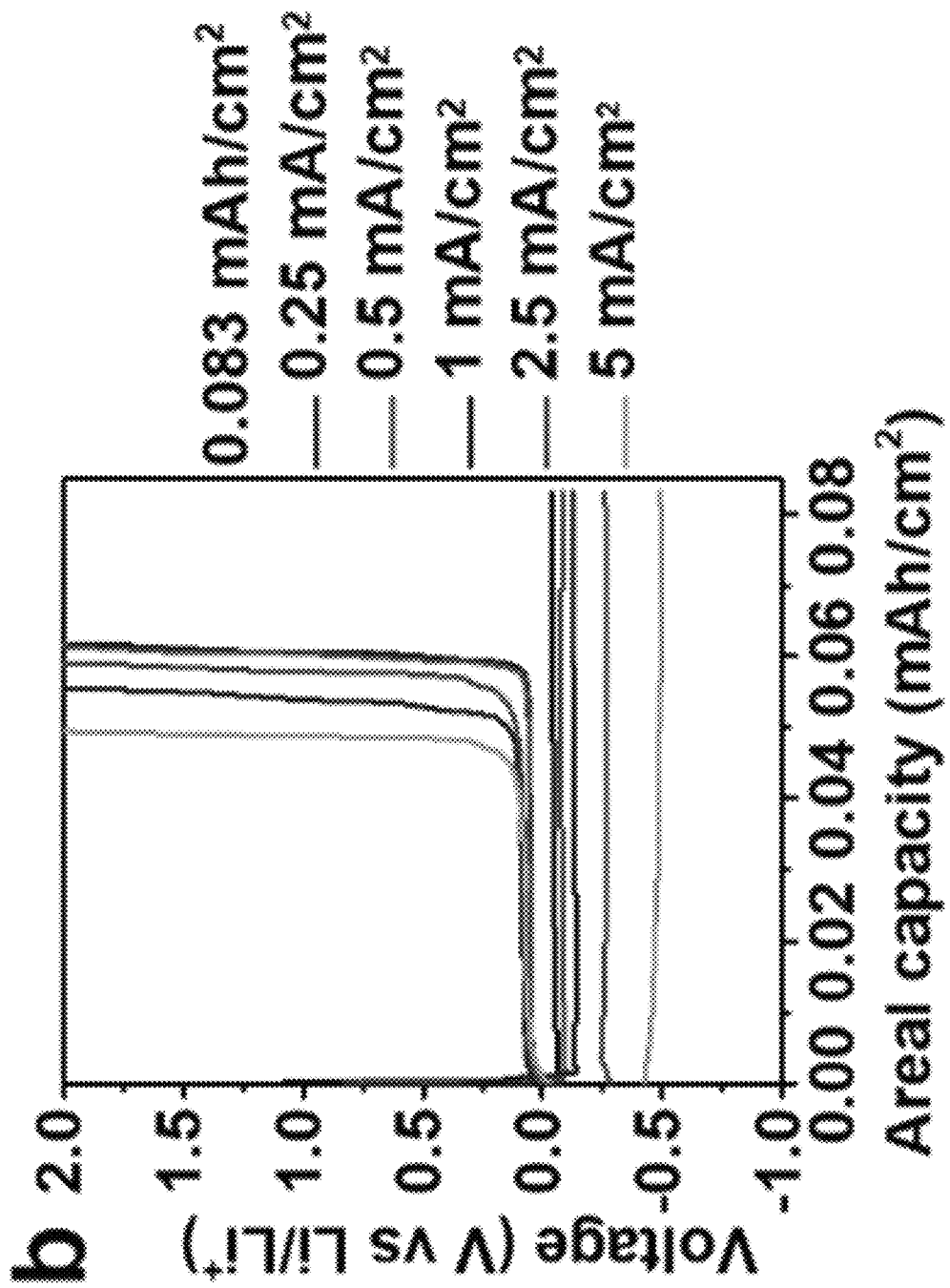
Figure 4C:
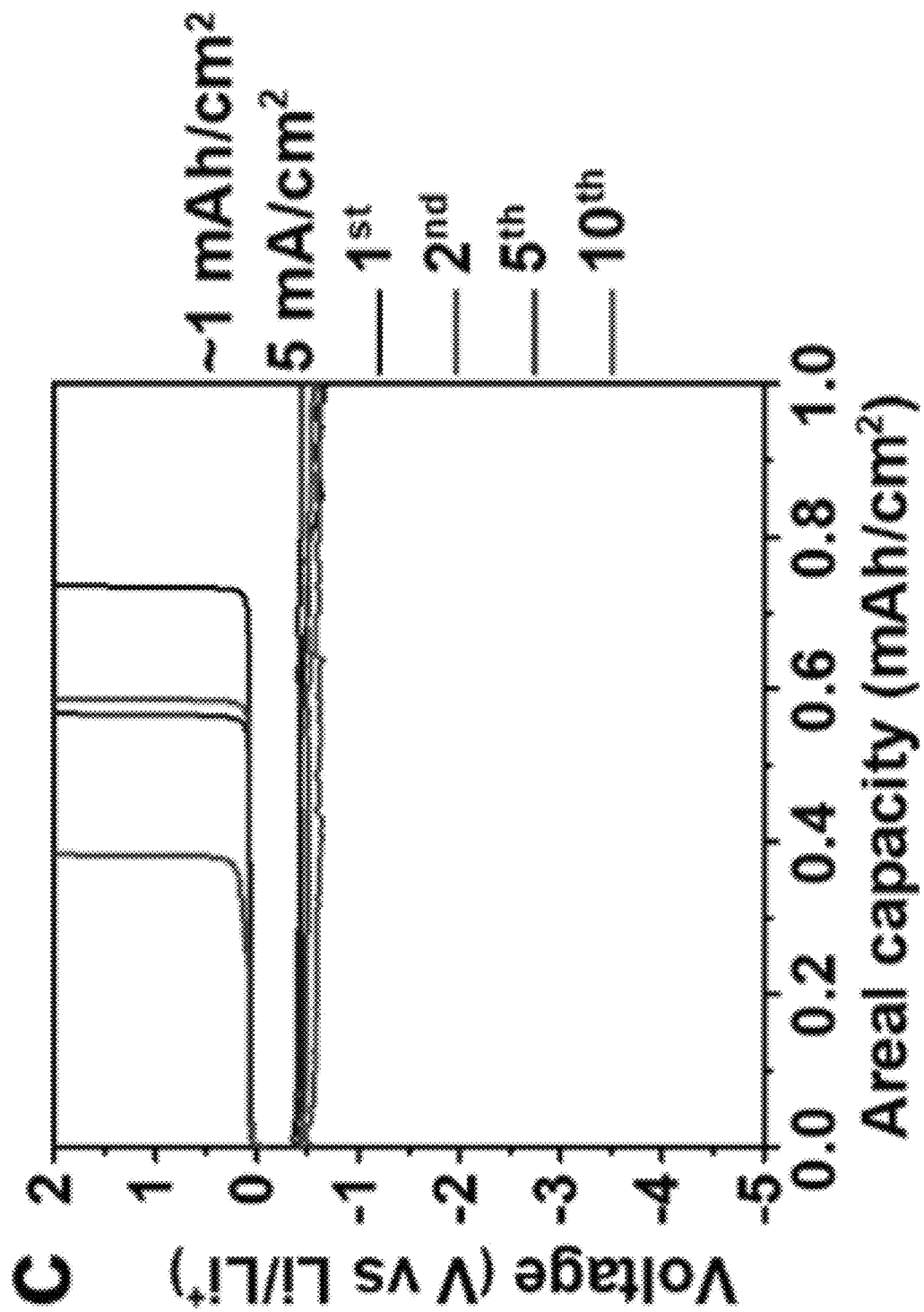
Figure 4D:
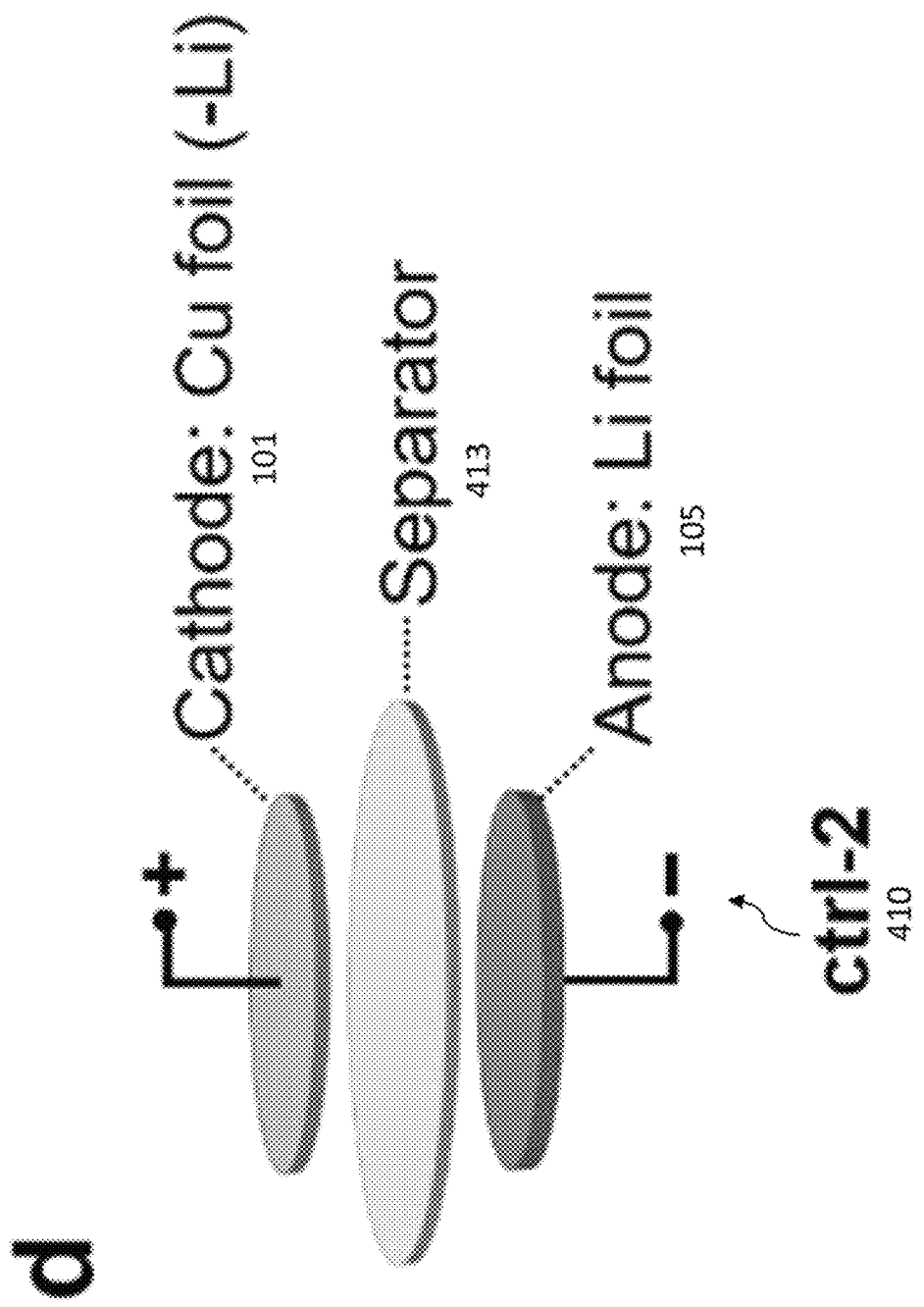
Figure 4E:
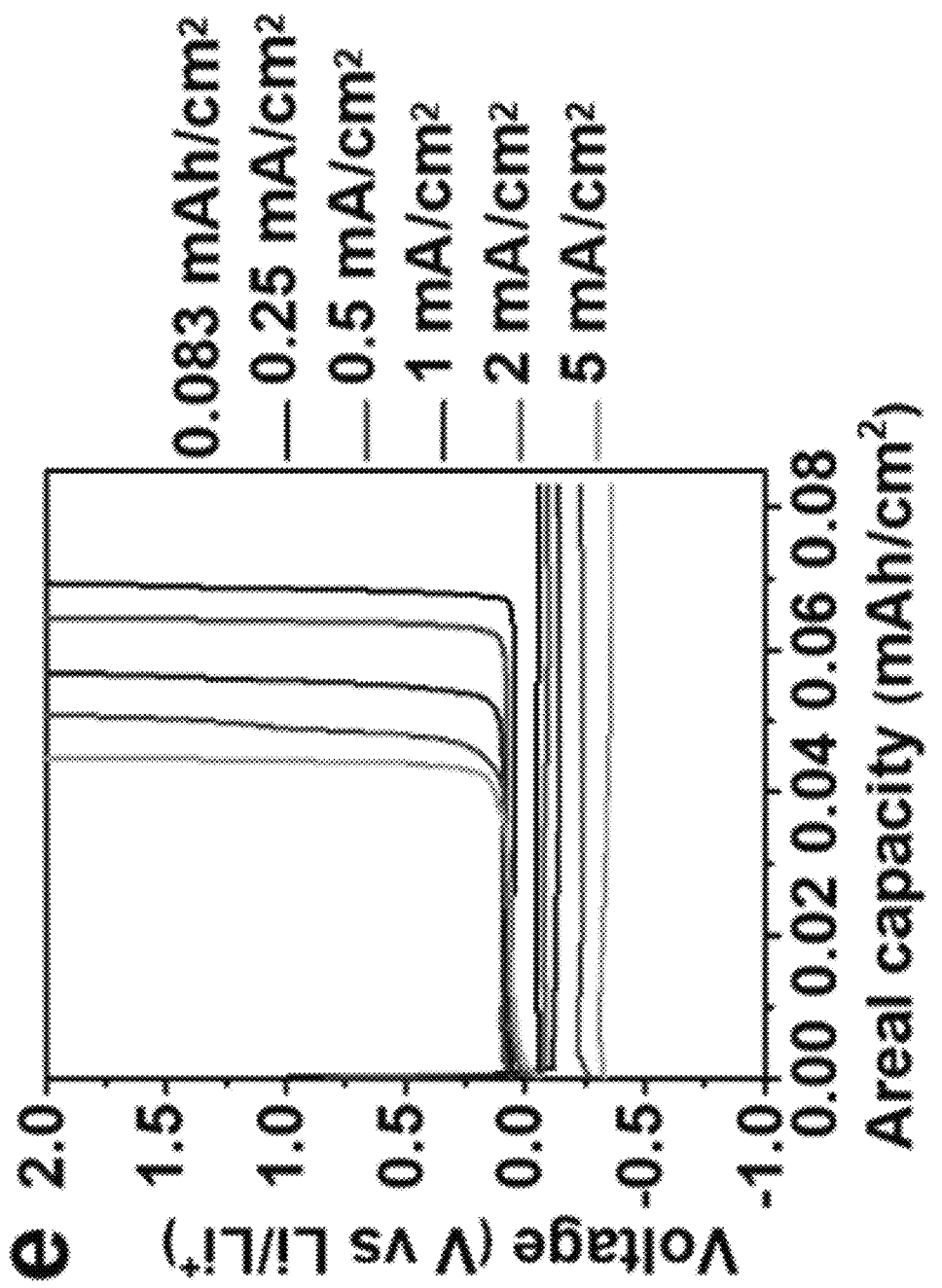
Figure 4F:
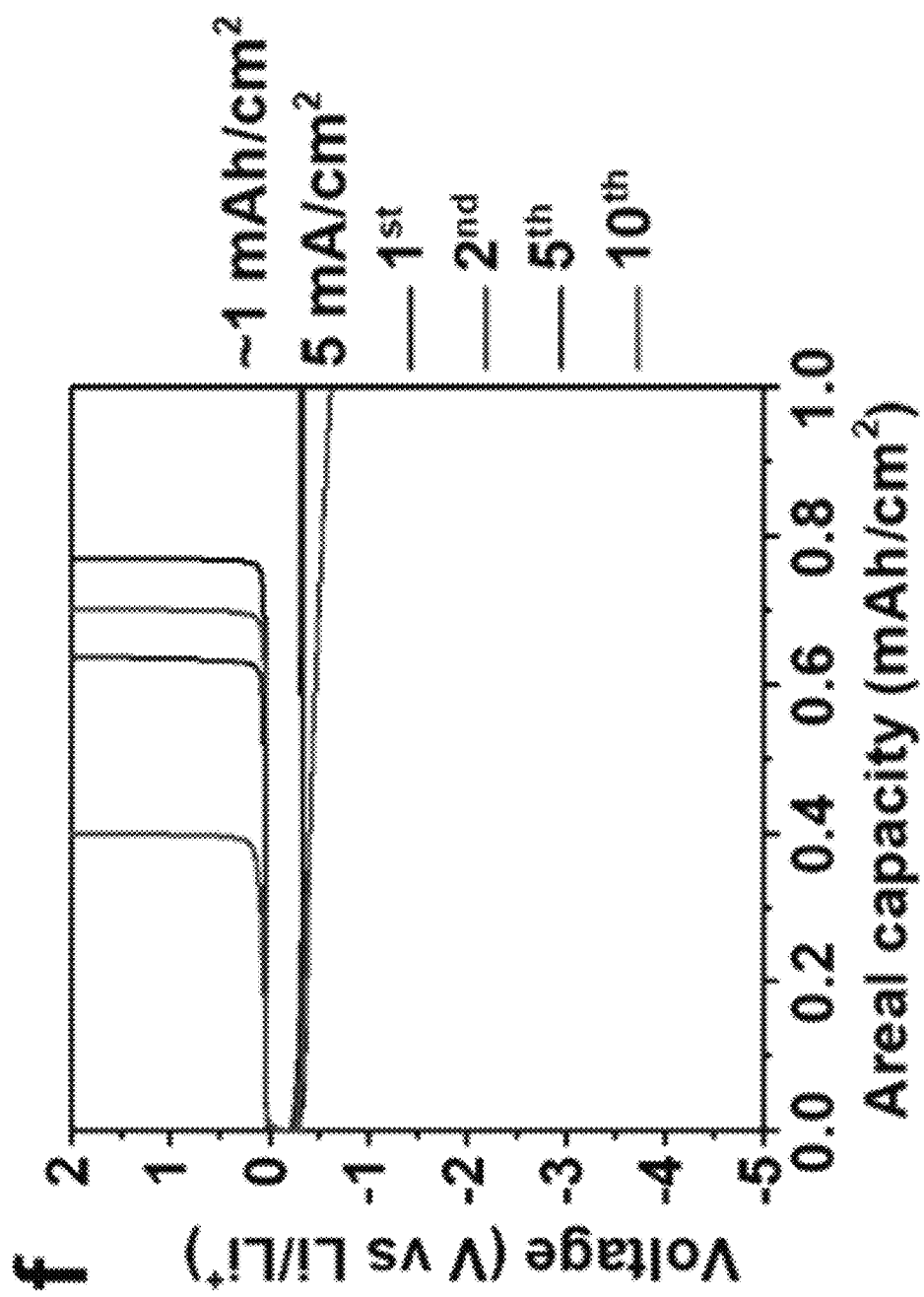

The dendrite-detection alert signal was observed when the discharge capacity was raised to 1 mAh/cm² while maintaining the high rate (5 mA/cm²). The high capacity was intended to increase the thickness of the dendrite layer so that the dendrites would extend to the RP coating. A striking decrease of voltage (|ΔV|>2 V) was observed (FIG. 1D) in the first discharge step. The RP-coated separator remained red and clean with no visible impurities at ~0.083 mAh/cm², and only RP particles were observed (FIG. 1E and FIGS. 6A-6D). Two control samples were tested using the same protocol, and the voltage change was not present in either sample. FIG. 4A shows the half-cell 400 ctrl-1 that is similar to P-hc 100, except that its separators 403 are without any RP layer. FIG. 4D shows the half-cell 410 ctrl-2 that is similar to half-cell 400 ctrl-1, except that it only has one separator 413 (which is without any RP layer) between cathode 101 and anode 105. FIG. 4B is the voltage profile of ctrl-1 at low areal capacity (~0.083 mAh/cm²). FIG. 4C is the voltage profile of ctrl-1 at 5 mA/cm² and high areal capacity (~1 mAh/cm²). FIG. 4E is the voltage profile of ctrl-2 at low areal capacity (~0.083 mAh/cm²). FIG. 4F is the voltage profile of ctrl-2 at 5 mA/cm² and high areal capacity (~1 mAh/cm²).

Figure 1H:
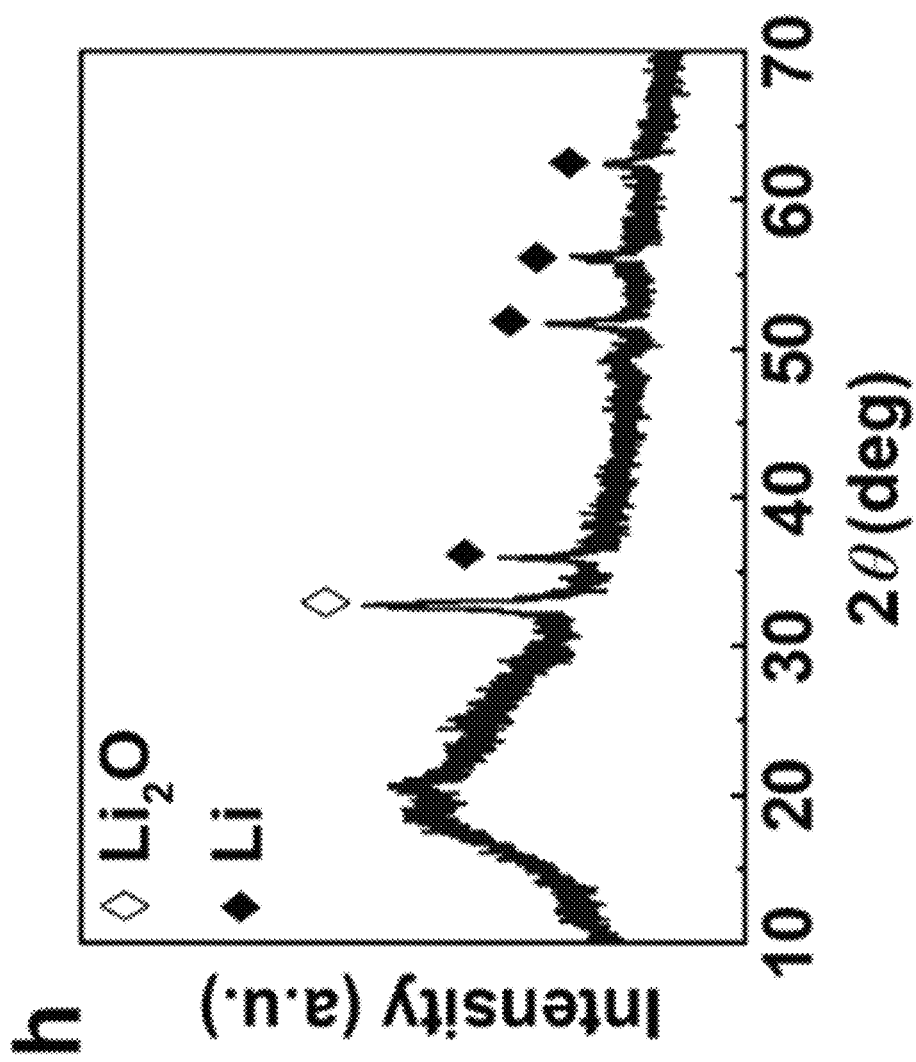
Figures 1I, 1J:
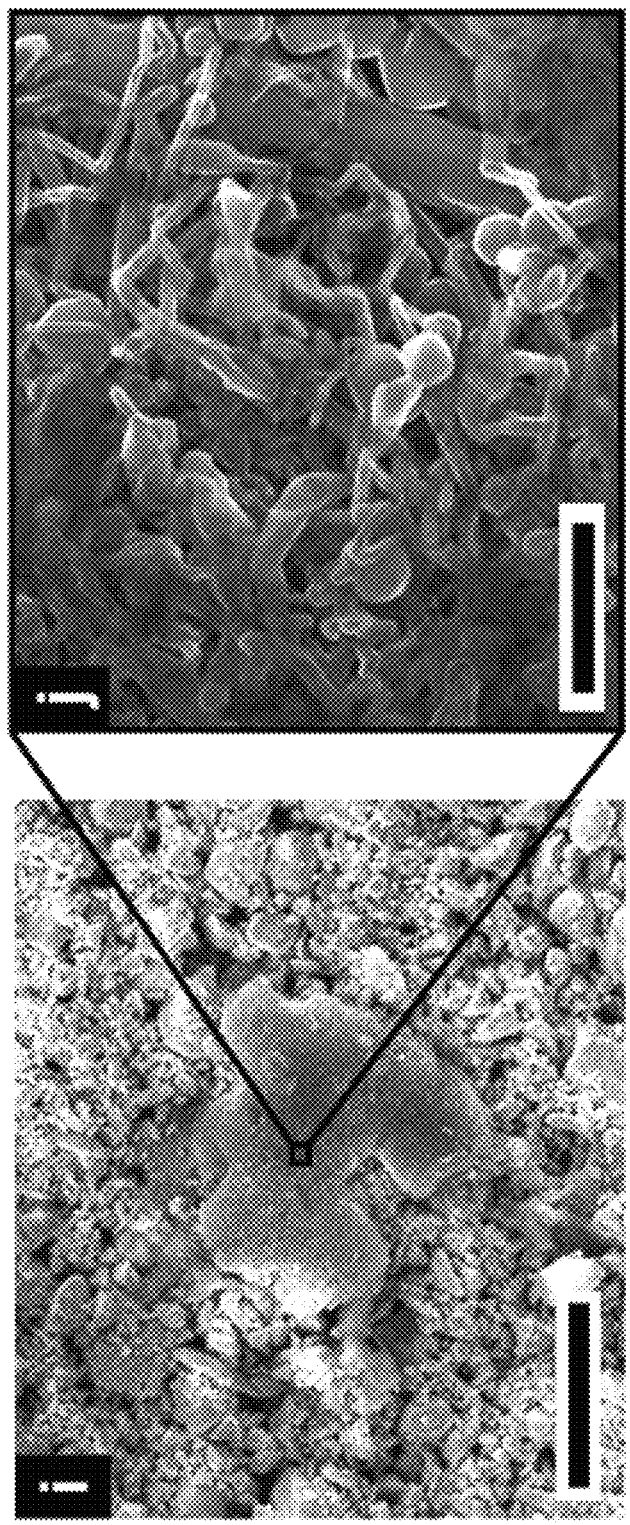

Referring back to FIGS. 1F-1G, at ~1 mAh/cm², silver-colored spots with metallic appearance were apparent on the RP (FIG. 1F), which grew larger after another 9 cycles (FIG. 1G). The presence of Li metal in FIG. 1G was confirmed by the X-ray diffraction (XRD) spectrum (FIG. 1H), scanning electron microscopy (SEM) and energy-dispersive X-ray spectroscopy (EDS) mapping (FIGS. 1I-1J and FIGS. 8A-8I). [Li 2018].

Figure 6A:
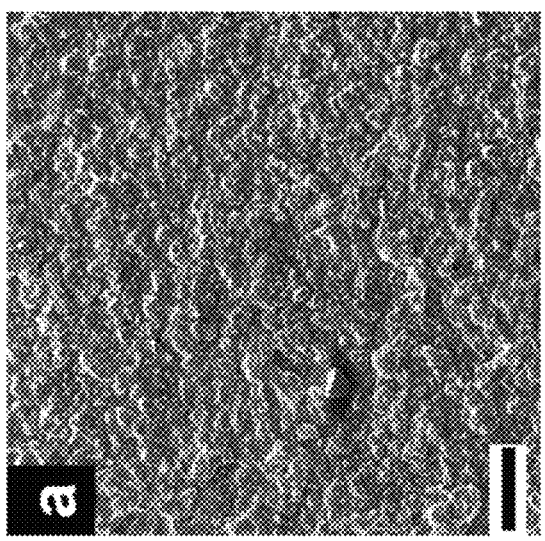
FIG. 6A is an SEM image of the RP-coated separator shown in FIG. 3A (after the last discharge step at ~0.083 mAh/cm$^2$).
Figure 6B:
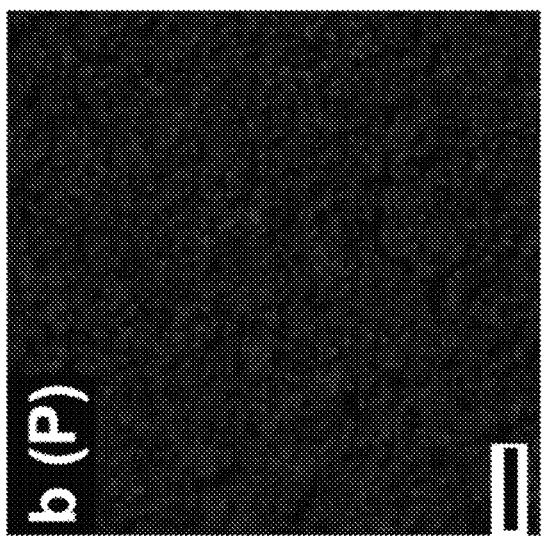
FIGS. 6B-6D are energy-dispersive X-ray spectroscopy (EDS) mapping of P, O and F for the SEM of FIG. 6A. The scale bars for FIGS. 6A-6D is 200 μm.
Figure 6C:
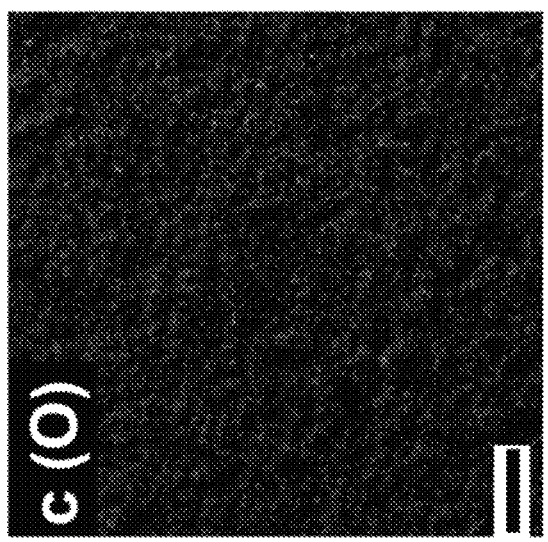
Figure 6D:
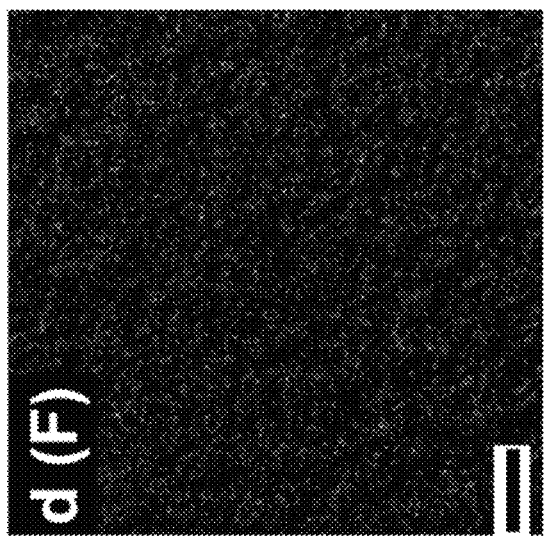
Figure 7A:
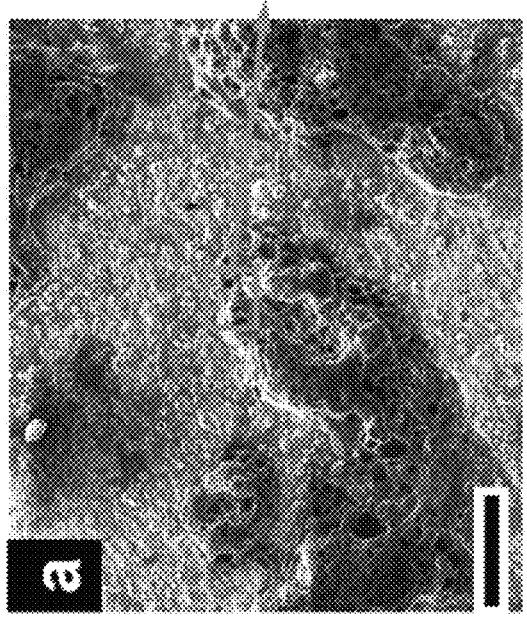
FIG. 7A-7B are SEM images of the silver-colored spots on the RP-coated separator shown in FIG. 1F (after the first discharge step at ~1 mAh/cm$^2$).
Figure 7B:
Figure 7C:
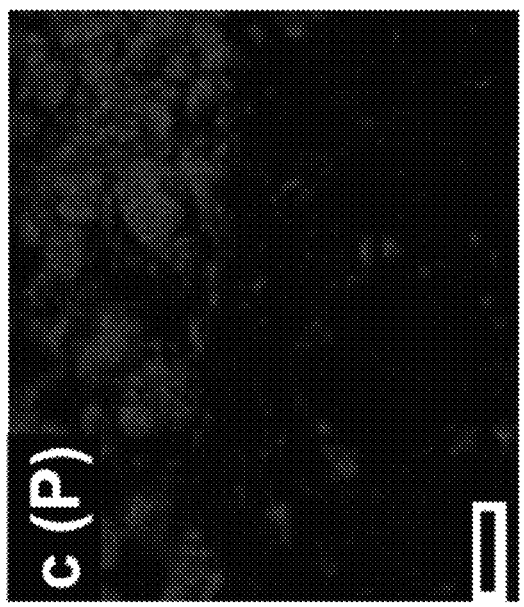
FIGS. 7C-7D are the EDS mapping of P and O for FIG. 7B.
Figure 7D:
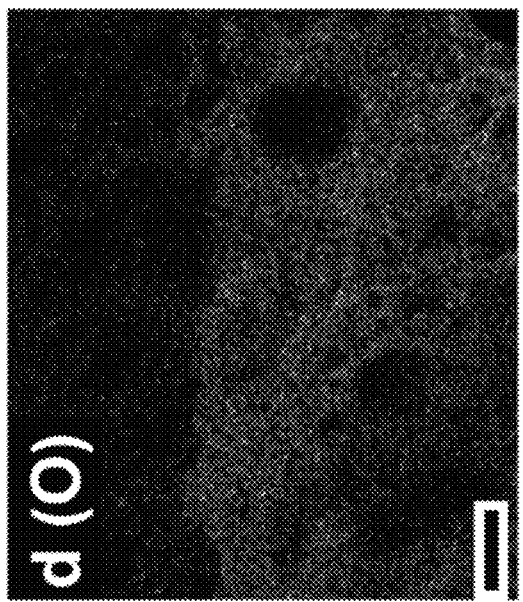
Figure 7F:
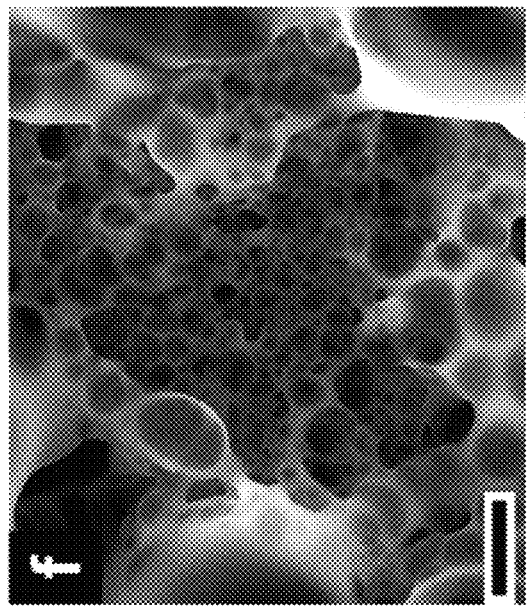
FIGS. 7E-7F are SEM images of Li metal deposited on the Cu foil at the same stage as in FIG. 1F. The scale bars for FIGS. 7A, 7B-7E, and 7F are 500 μm, 50 μm, and 5 μm, respectively.
Figure 7E:
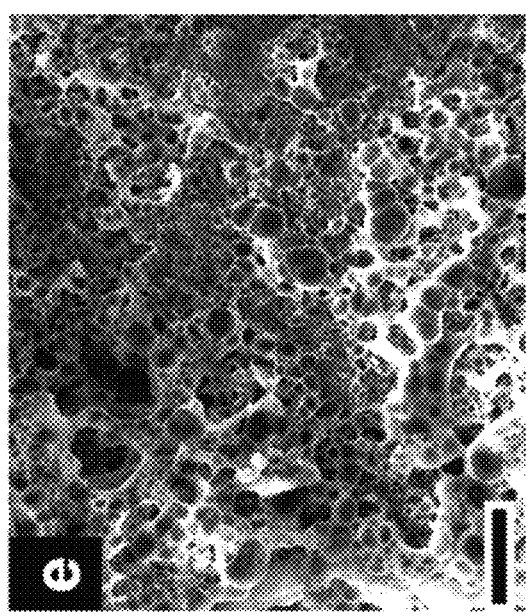
Figure 8G:
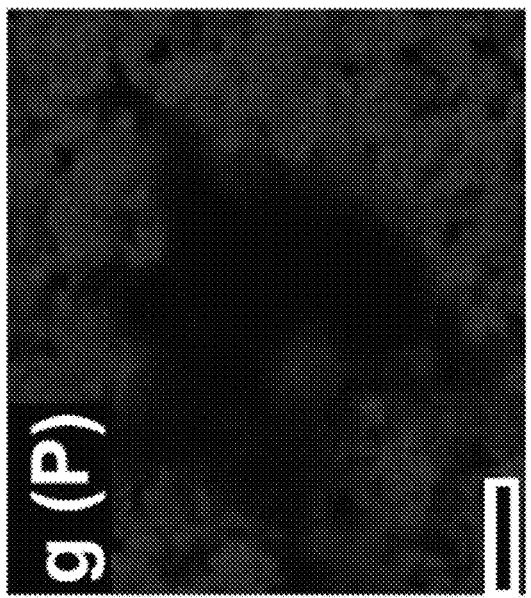
FIGS. 8G-8I are the EDS mapping of P, O and F for FIG. 8F. The scale bars for (i) FIG. 8A, (ii) FIGS. 8B and 8D, (iii) FIGS. 8C and 8E, and (iv)
Figure 8I:
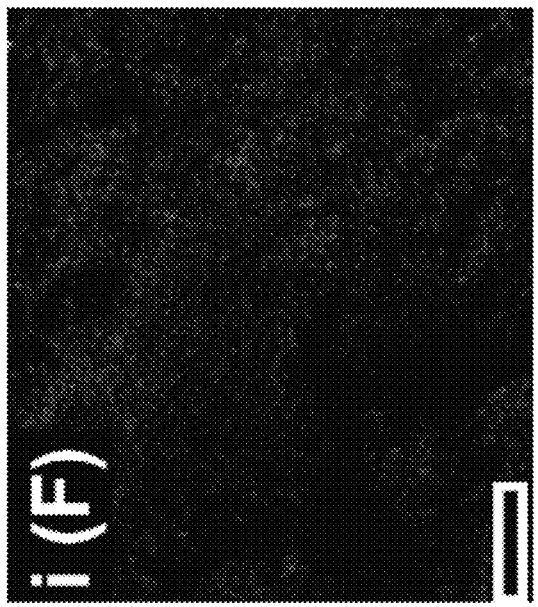
Figure 8F:
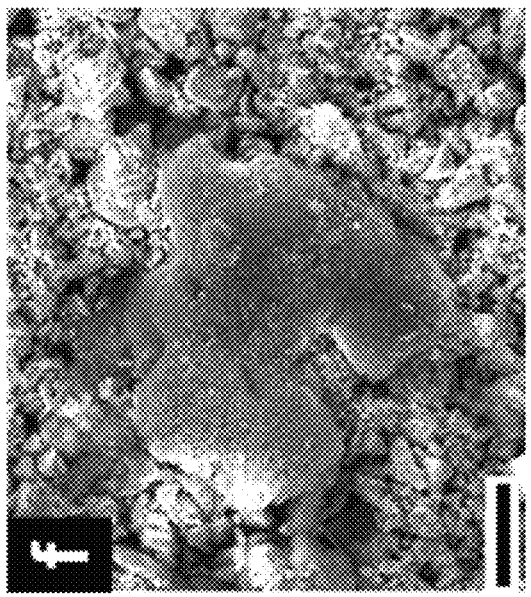
FIG. 8F shows the same aggregate of dendrites in the center of FIG. 8A.
Figure 8H:
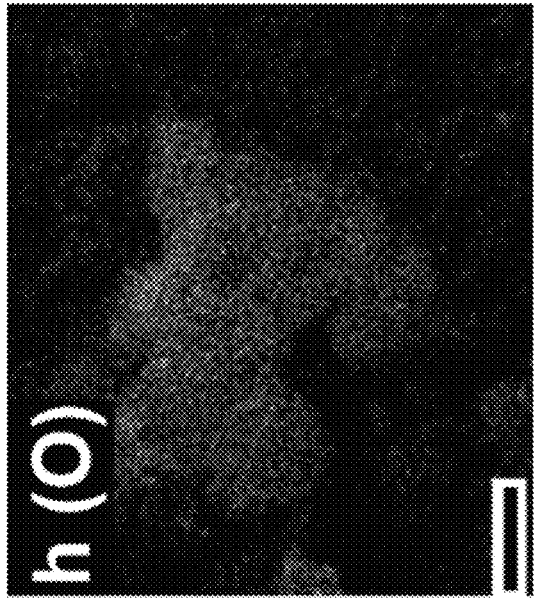
Figure 10A:
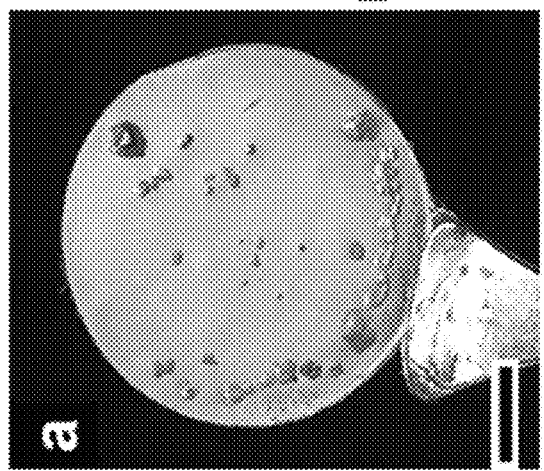
FIGS. 10A and 10B-10C are, respectively, a photograph and SEM images of the middle separator on the bottom side (facing the Cu foil) from ctrl-1 shown in FIG. 4A after the first discharge step at ~1 mAh/cm$^2$. The scale bars for FIGS. 10A-10C are 5 mm, 20 μm, and 2 μm, respectively.
Figure 10B:
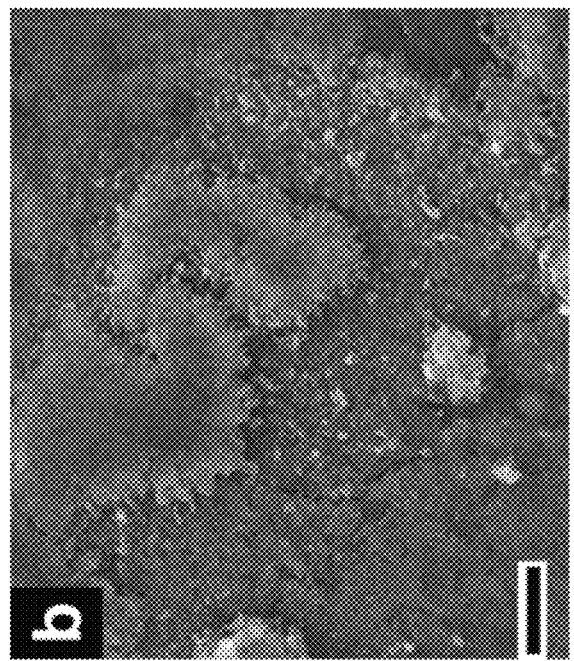
Figure 10C:
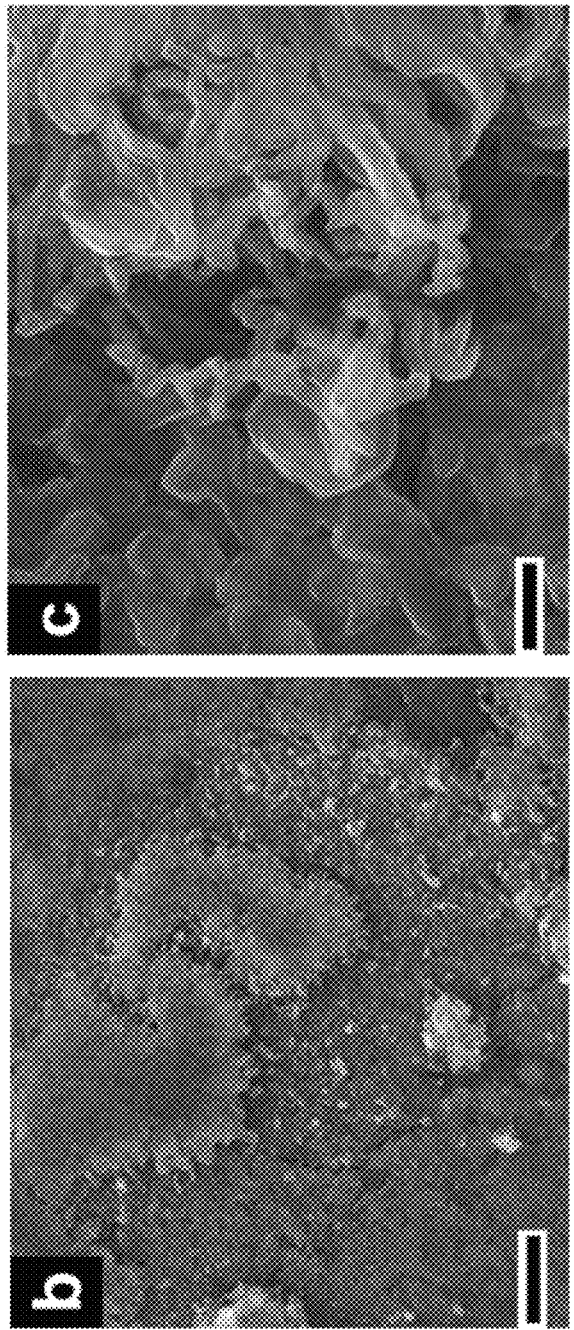
Figure 11A:
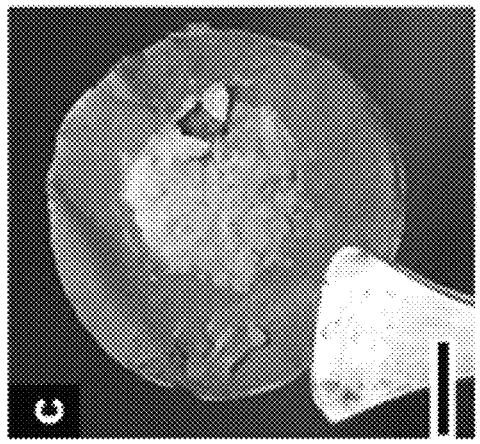
FIGS. 11A-11C are photographs for the RP-coated separators in full-cells at different stages, namely 0.083 mAh/cm$^2$ (last cycle), 1 mAh/cm$^2$ (first cycle), and 1 mAh/cm$^2$ (tenth cycle). The scale bars for FIGS. 11A-11C are each 5 mm.
Figure 11B:
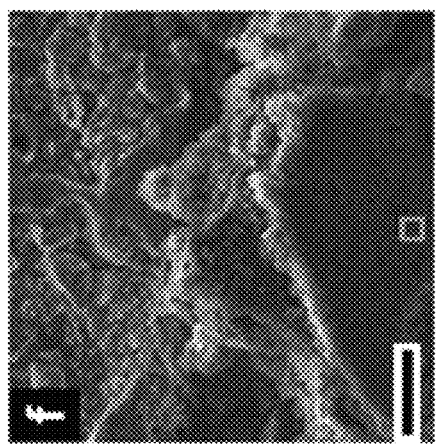
Figure 11C:
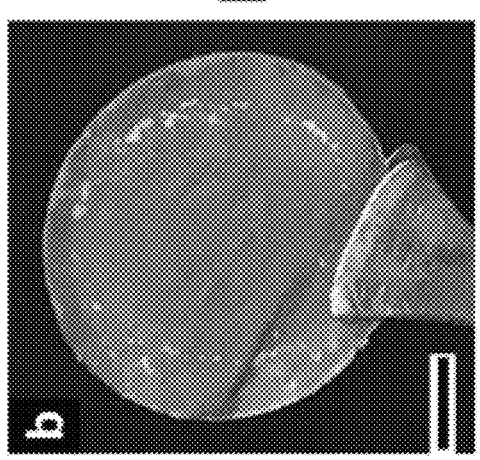
Figure 11D:
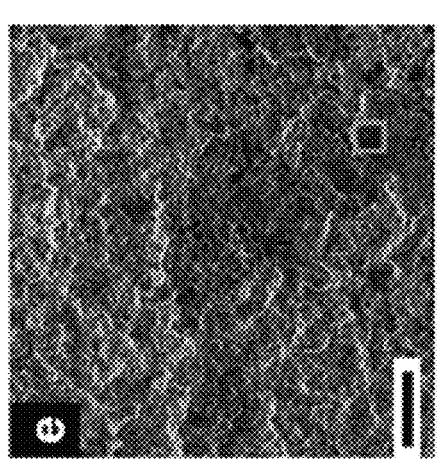
FIG. 11D-11F are SEM images of the RP-coated separators shown in FIGS. 11A-11C, respectively. The scale bars for FIGS. 11D-11E and FIG. 11F are 200 μm and 50 μm, respectively.
Figure 11E:
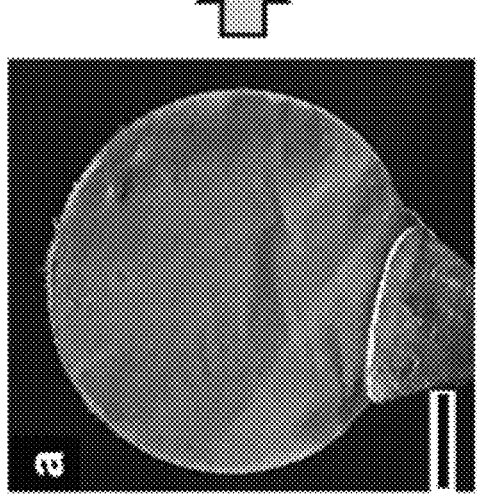
Figure 11F:
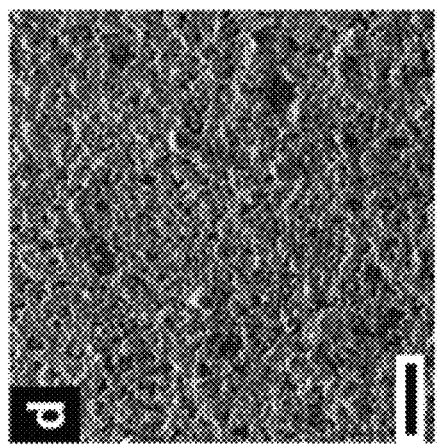
Figure 11G:
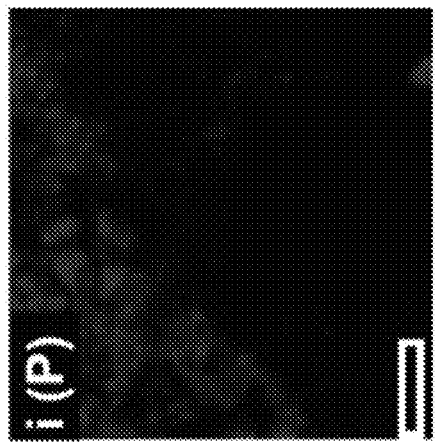
FIG. 11G-11I are the EDS mapping for P of FIG. 11D-11F, respectively. The scale bars for FIGS. 11G-11H and FIG. 11I are 200 μm and 50 μm, respectively.
Figure 11H:
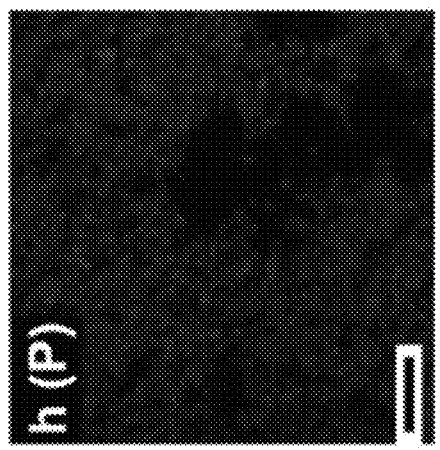
Figure 11I:
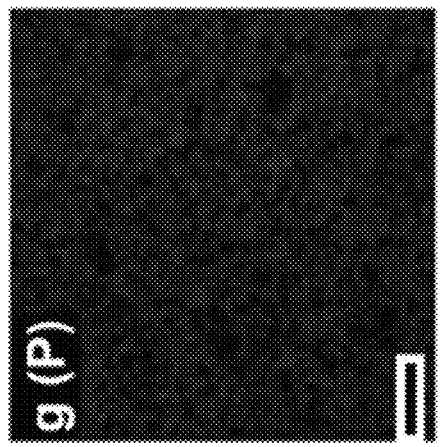
Figure 11J:
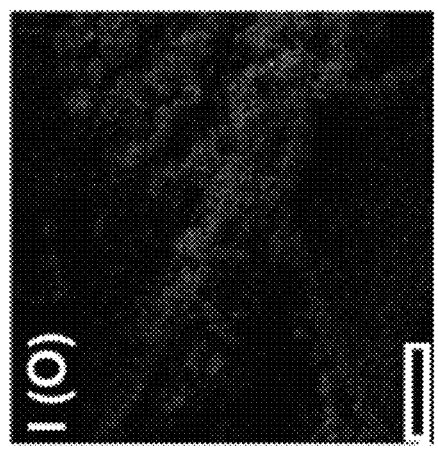
FIG. 11J-11L are the EDS mapping for O of FIG. 11D-11F, respectively. The scale bars for FIGS. 11J-11K and FIG. 11L are 200 μm and 50 μm, respectively.
Figure 11K:
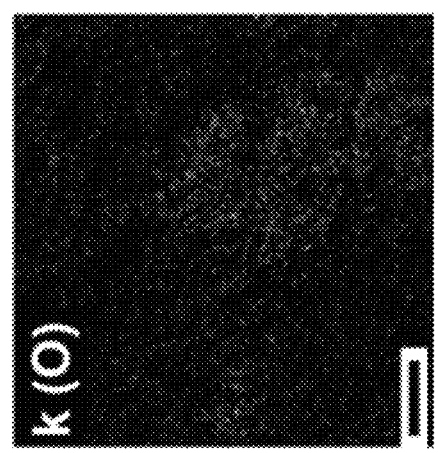
Figure 11L:
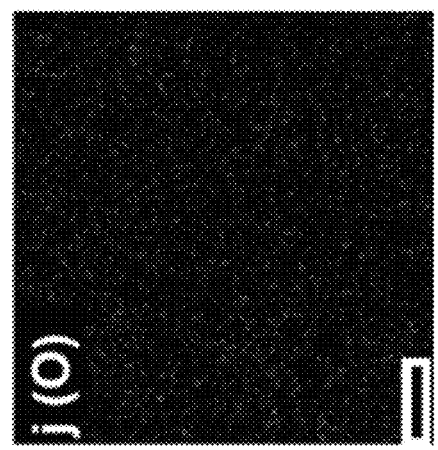
Figure 11M:
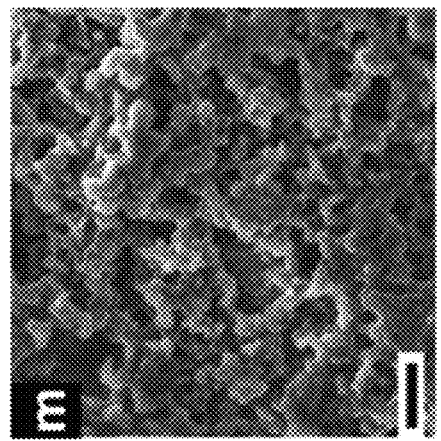
FIG. 11M-11N are SEM images of the RP-coated separators shown in FIGS. 11B-11C, respectively. The scale bars for FIG. 11M and FIG. 11N are 20 μm and 2 μm, respectively.
Figure 11N:
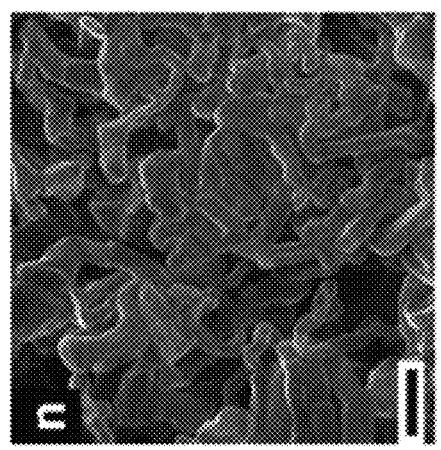
Figure 12A:
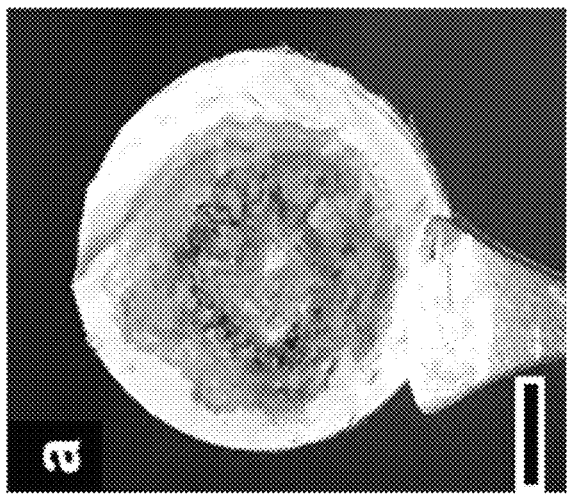
FIGS. 12A and 12B-12C are, respectively, a photograph and SEM images of the middle separator on the bottom side (facing the Cu foil) from ctrl-3 shown in FIG. 9C after the tenth discharge step at ~1 mAh/cm$^2$. The scale bars for FIGS. 12A-12C are 5 mm, 20 μm, and 2 μm, respectively.
Figure 12C:
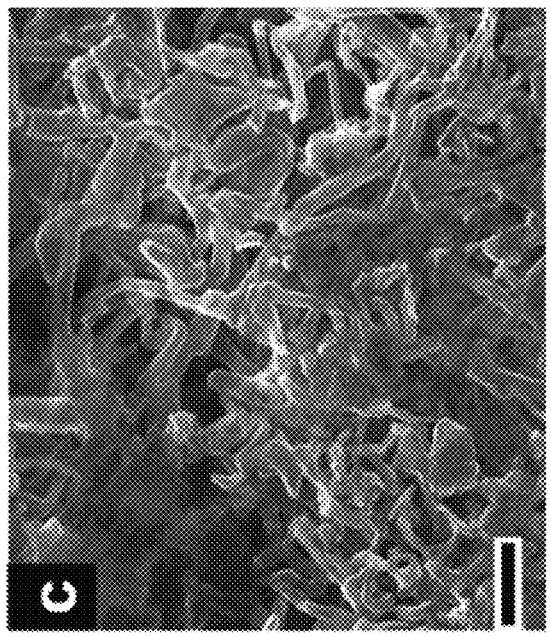
Figure 12B:
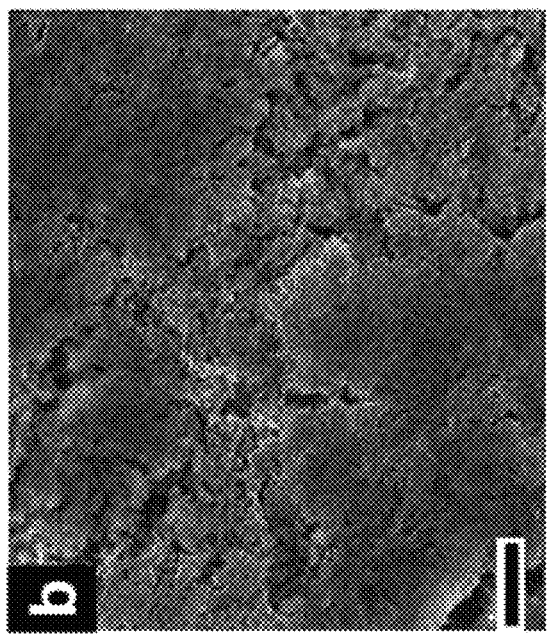

Although Li is not active in EDS, we found large amounts of oxygen (FIGS. 7D and 8H) distributed in the area suspected to be Li metal, likely resulting from $Li_2O$ that formed when the sample was exposed to air during the transfer from an Ar-filled box to the SEM chamber. The surrounding particles were confirmed to be RP (FIGS. 6B, 7C, and 8G). The control cell ctrl-1 was also opened after discharging at 5 mA/cm² to ~1 mAh/cm² for 10 cycles, and Li dendrite formation was revealed by the visual appearance and the SEM images (FIGS. 10A-10C), meaning that dendrite growth reached the same level without the RP coating, but no significant voltage change was detected. This indicates that the RP coating was indeed responsible for the dramatic voltage change in FIG. 1D. It is also found that the initial cycling at low capacity had facilitated dendrite growth presumably by increasing the thickness of the dendrite layer.

Figure 3A:
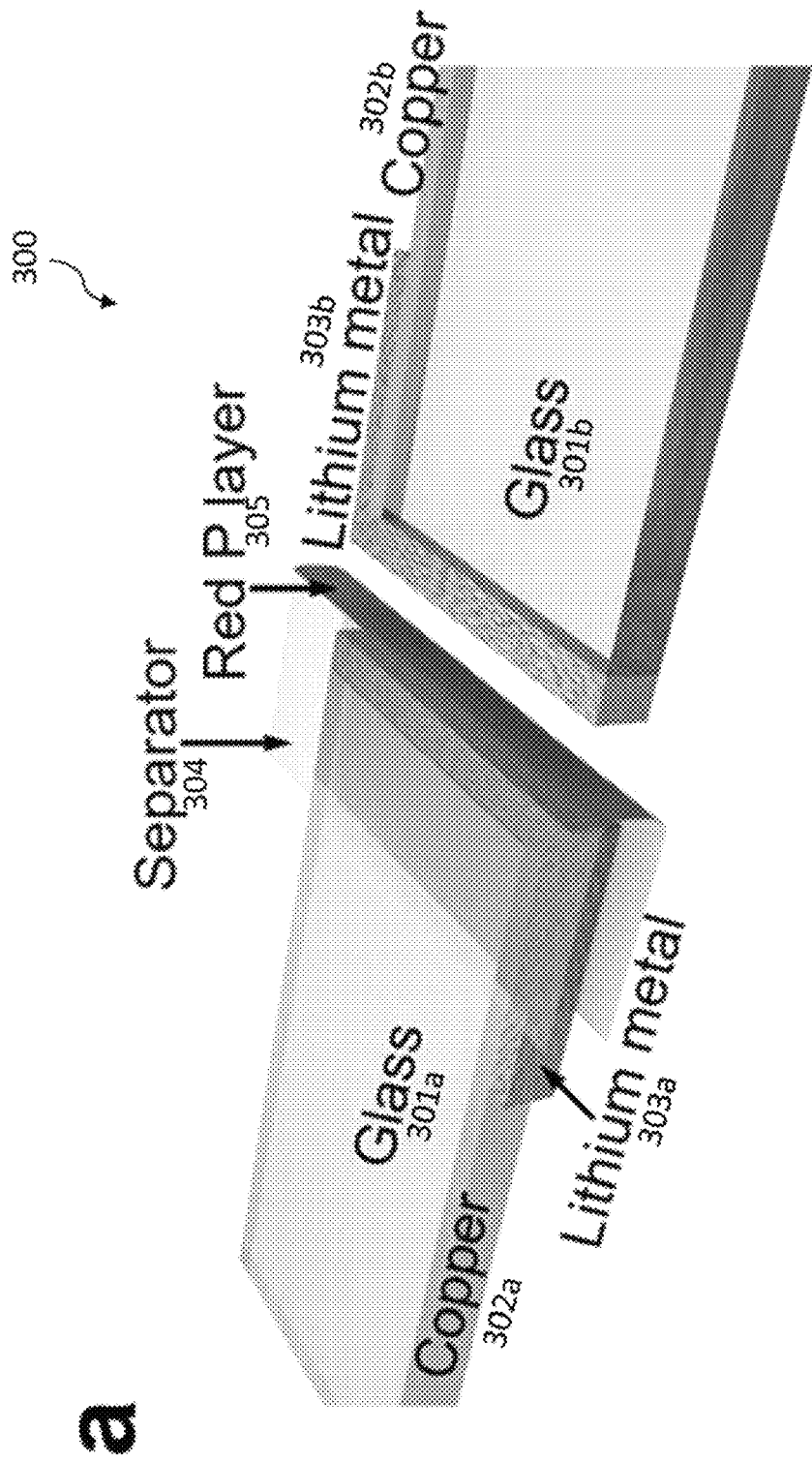
FIGS. 3A-3D shows dendrite growth visualized while monitoring the cell voltage.

The dendrite growth was visualized using a homemade transparent cell 300 shown in FIG. 3A. Transparent cell 300 includes glass substrates 301a and 301b (such as 75×25×1 mm³, Corning), with each glass slide having, respectively, copper 302a and 302b (such as 25 μm copper ribbons, Alfa Aesar) and lithium metal 303a and 303b (such as 300 μm Li metal foil). A separator 304 having a RP layer 305 is positioned between the glass substrates 301a and 301b. Epoxy (extra fast setting, Hardman) was used to adhere the Li metal surface to the glass substrates and prevent leakage. The copper ribbons were used to electrically connect the Li metal electrodes to a battery testing station. The cell was filled with electrolyte (around 200 μL).

Figure 3B:
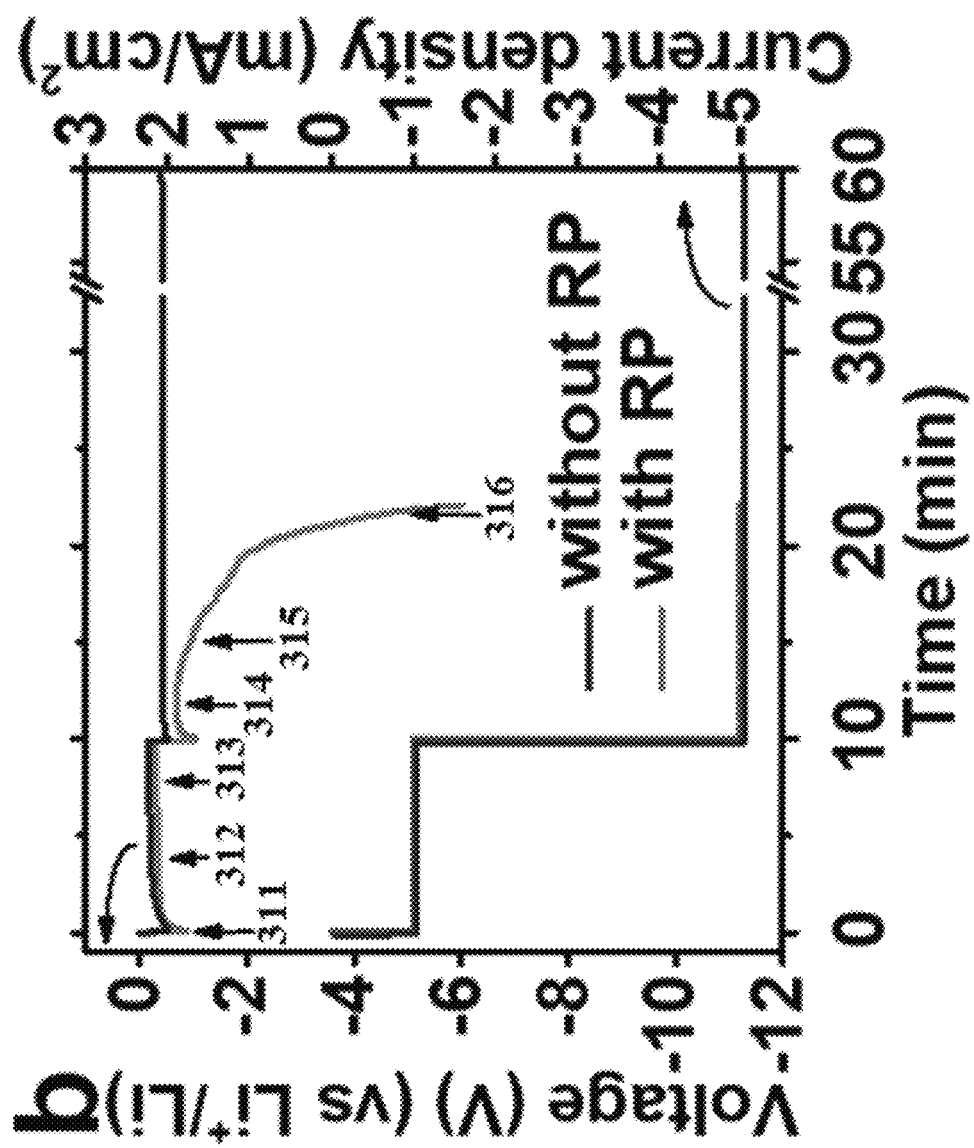
Figure 3C:
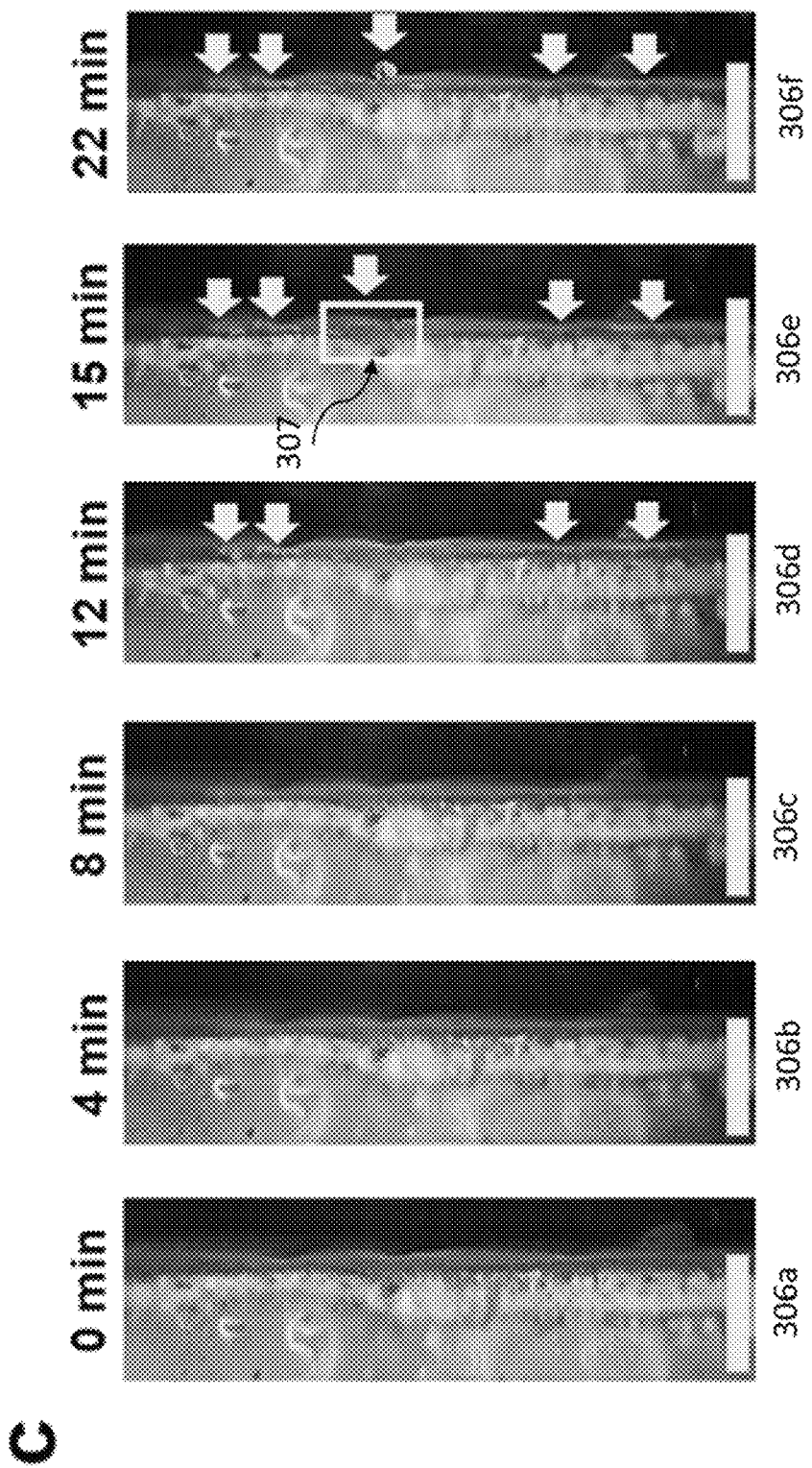
Figure 3D:
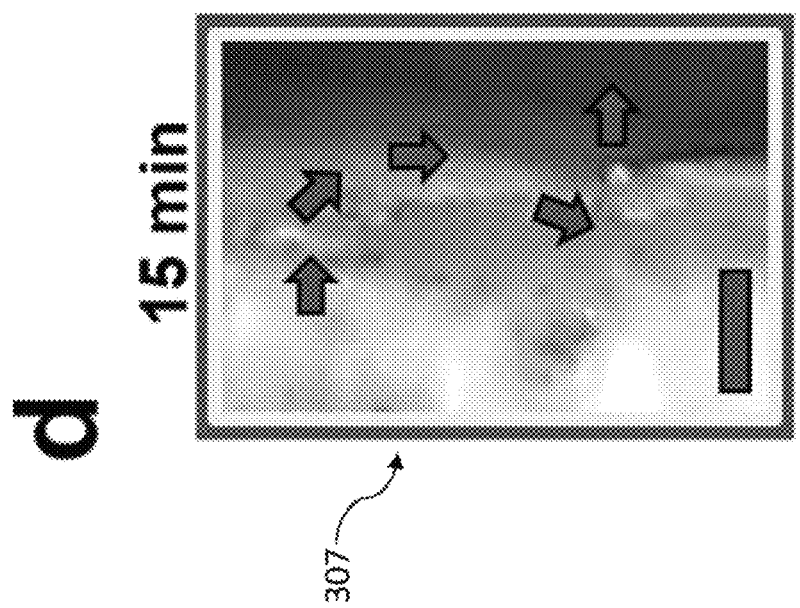

The cell voltage and the morphology of the discharged Li metal were monitored simultaneously. [Li 2018; Wood 2016]. As shown in FIG. 3B, a voltage drop to around 6 V was observed when Li dendrites contacted the RP-coated separator at 5 mA/cm² and, as shown in FIGS. 3C-3D, started growing along the RP. Times 311-316 correspond to different states of dendrite growth at 0, 4, 8, 12, 15, and 22 minutes, respectively. Photographs 306a-306f correspond to photograph taken at times 311-316, respectively. Box 307 in photograph 306e is enlarged and shown in FIG. 3D. The areas indicated by the arrows show signs of dendrite formation.

Figure 5A:
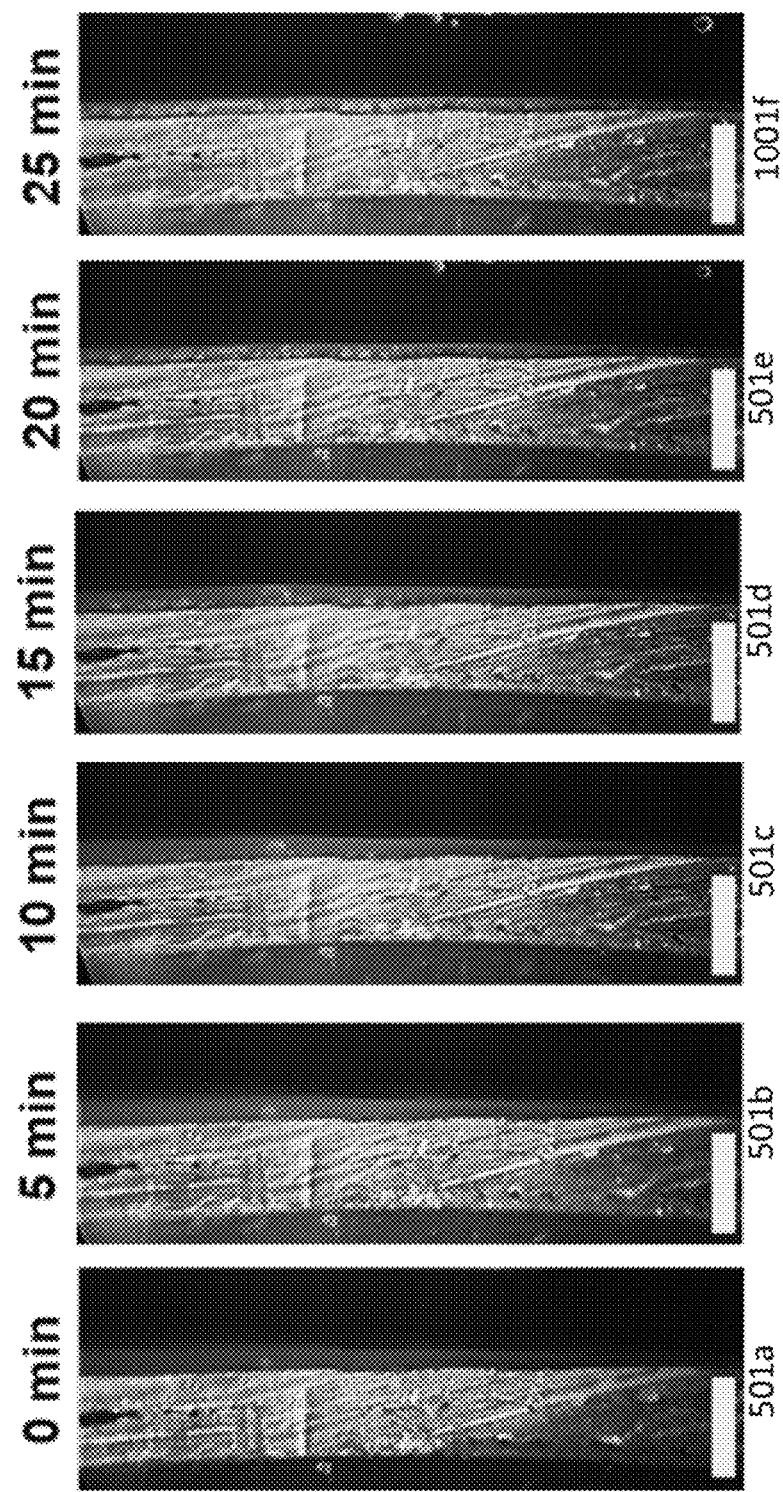
FIGS. 5A-5B are photographs (top view) showing dendrite growth at different stages in a transparent half-cell without a RP-coated separator. The scale bars for FIGS. 5A-5B are 1 mm and 0.2 mm, respectively.
Figure 5B:
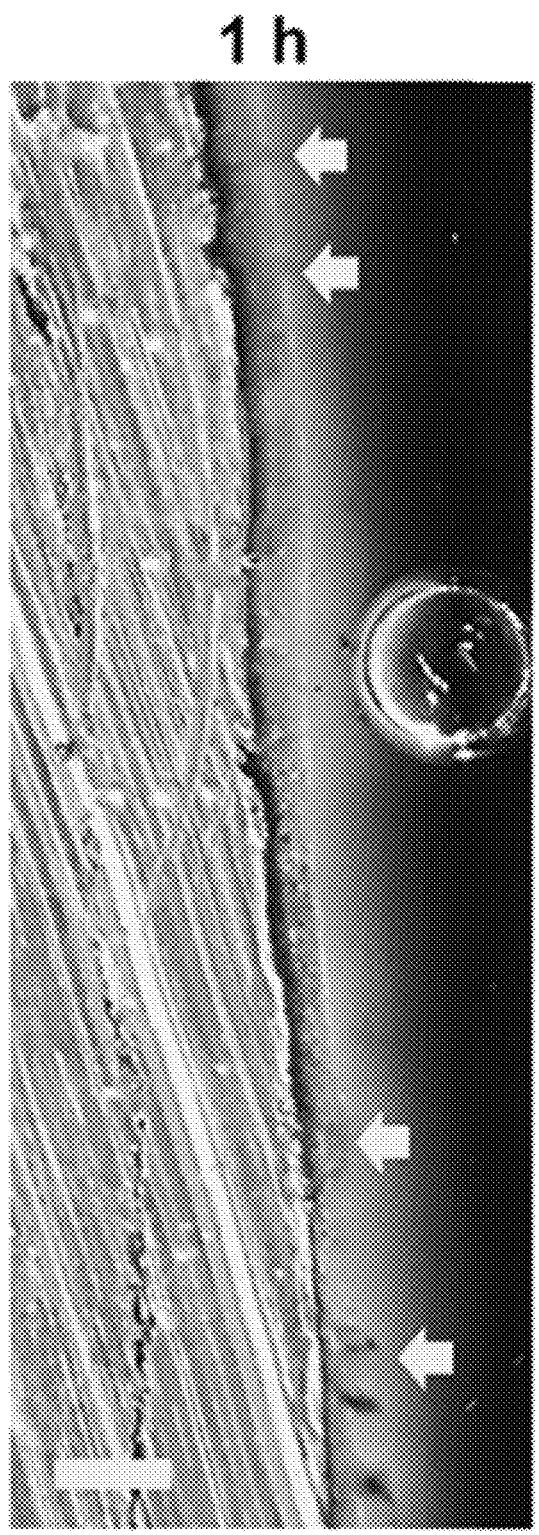

As shown in FIGS. 5A-5B, when an ordinary separator was used instead, no voltage change was observed when dendrites had contacted and penetrated the separator. Photographs 501a-501f correspond to photograph taken at 0, 5, 10, 15, 20, and 25 minutes, respectively. The photograph in FIG. 5B was taken at 1 hour. Again, the areas indicated by the arrows show signs of dendrite formation.

RP-Coated Separators in Full-Cells

Figure 9A:
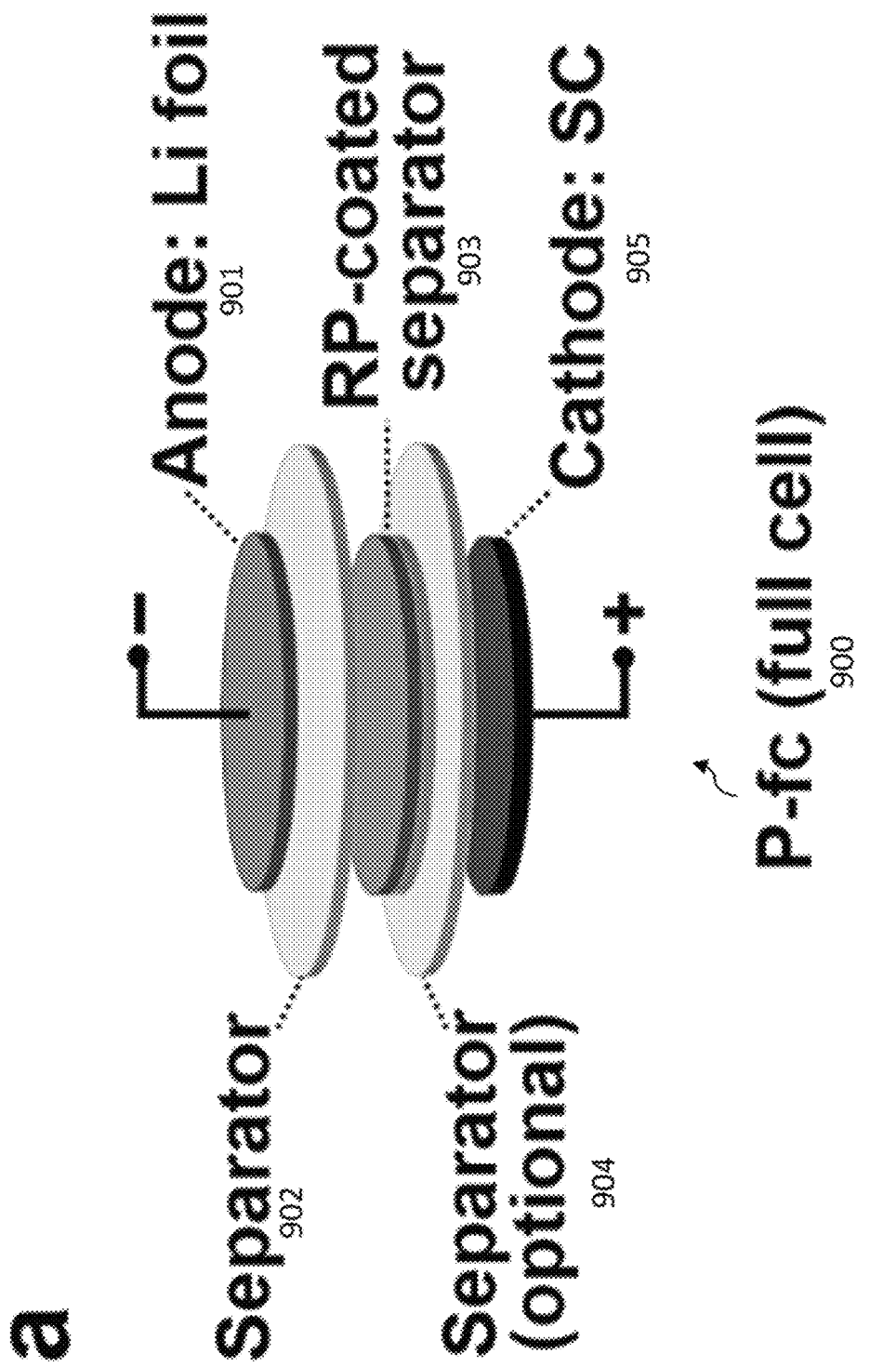
FIGS. 9A-9D show full-cell tests with and without a separator having an RP layer.

The configuration of a full-cell (P-fc) 900 is shown in FIG. 9A. The arrangement is similar to that of half-cell 100 shown in FIG. 1A, in that it has an anode 901, separator 902, RP-coated separator 903, separator 904 (which again is optional), and a cathode 905. In full-cell 900, cathode 905 contains a sulfurized carbon cathode. Sulfurized carbon was selected as the cathode material because of its high specific capacity and low charging voltage. This provides a 3 V window for the voltage to increase, with the voltage limit of the battery test equipment being 5 V. If conventional cathode materials are used, the voltage could only increase by 1-1.5 V.

Dendrite Detection Using RP-Coated Separators in Full-Cells

To demonstrate that the RP-coated separator could practically work in full Li metal batteries, it was tested in a full Li—S cell that, as shown in FIG. 9A, contained a sulfurized carbon cathode. The testing protocol for full-cells was the same as used for half-cells, except that the charge rate was tuned while the discharge rate was fixed.

Figure 9B:
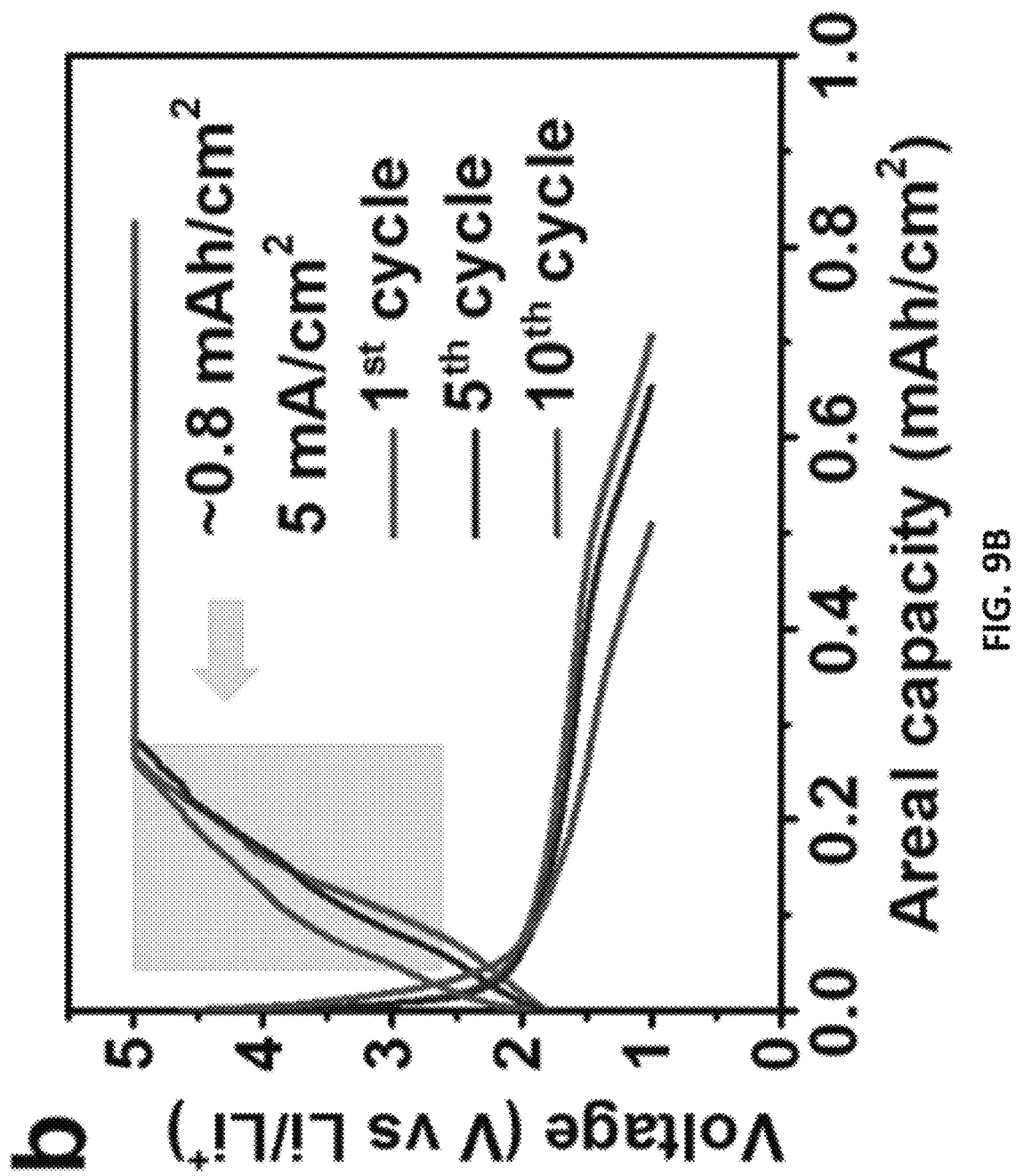
Figure 9C:
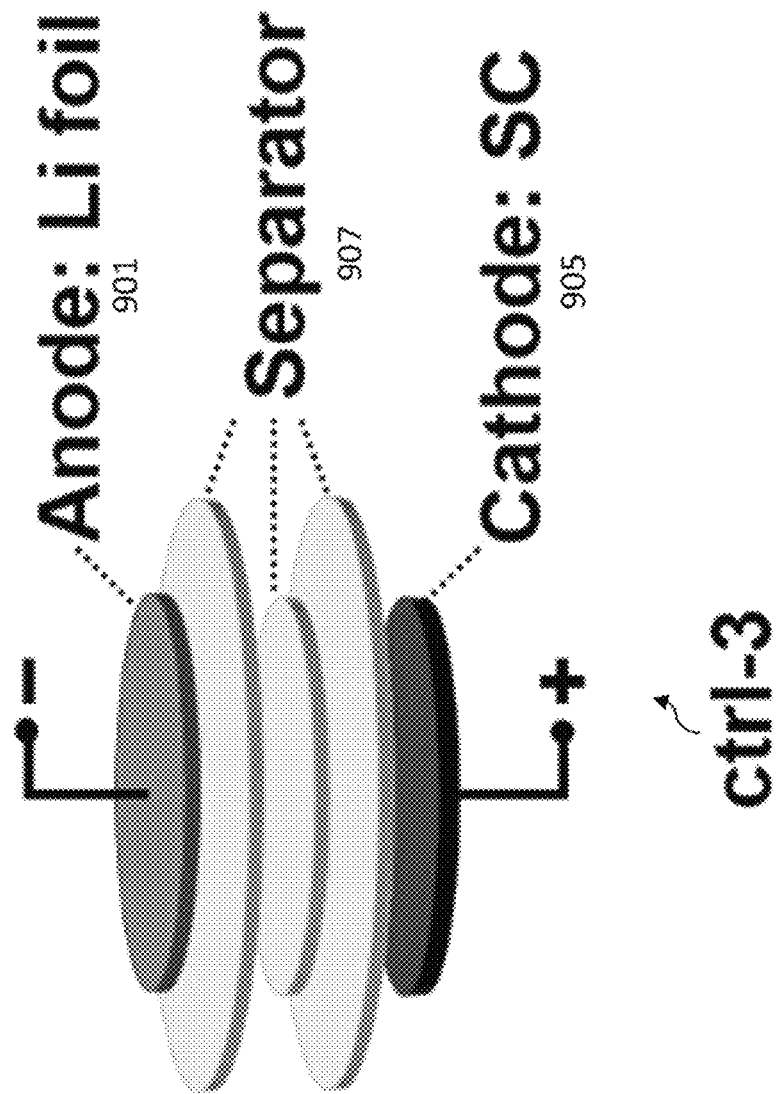
Figure 9D:
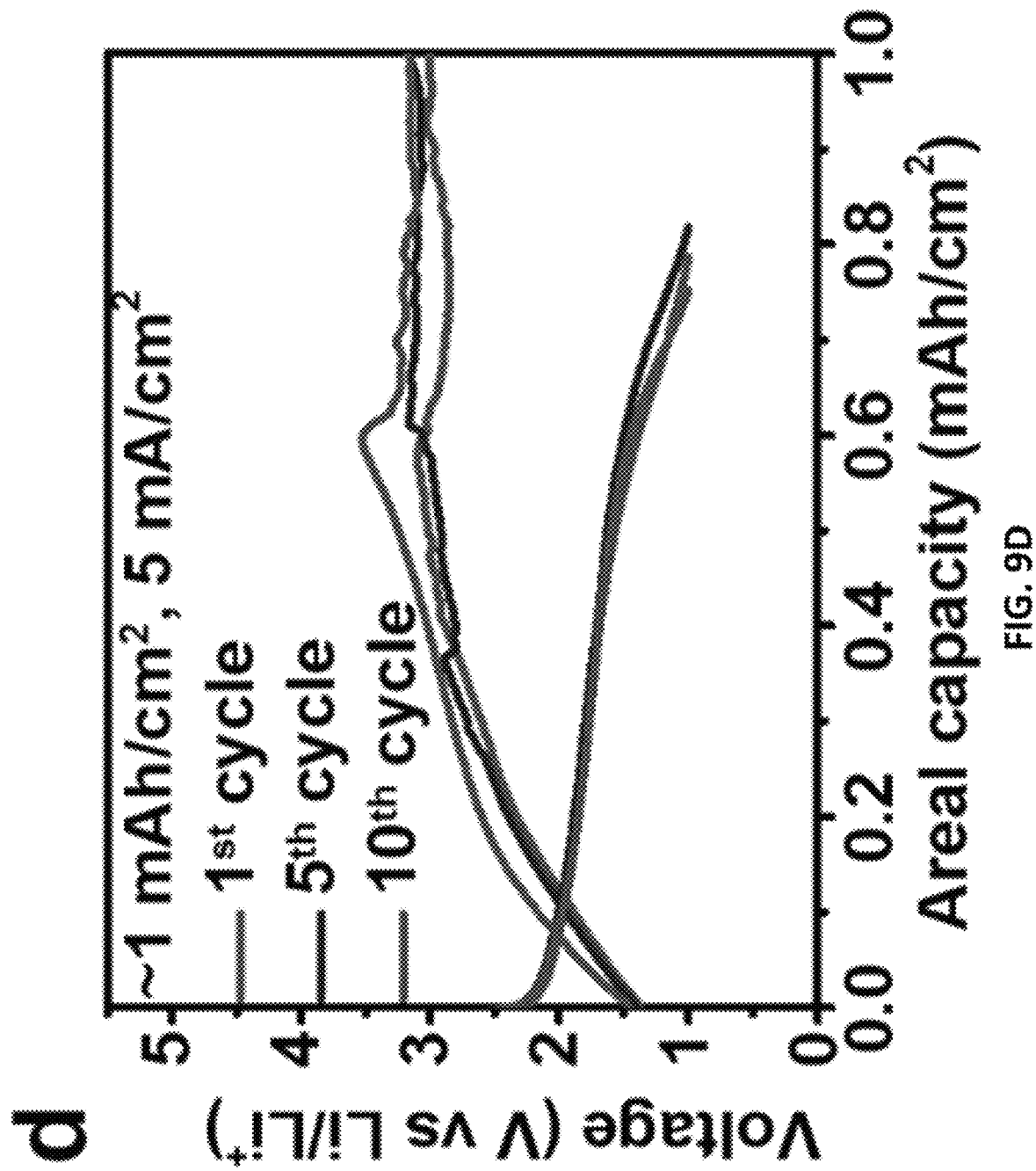

A dramatic voltage increase ($|\Delta V|>2$ V) was observed at ~0.8 mAh/cm$^2$ (FIG. 9B), which is consistent with the voltage decrease in half-cells, while the control sample 906 (ctrl-3) in FIG. 9D had a normal charge plateau at ~2.5 V. (FIG. 9D). (As shown in FIG. 9C, control sample 906 includes anode 901, cathode 905 and separators 906, none of which separators having an RP coating). The voltage increase indicated by the arrow in FIG. 9B is the electrochemical response generated when the Li dendrites contact the RP coating.

The fact that the voltage stayed >5 V for more than 6 min in the P-fc revealed another advantage of using an overpotential instead of detecting short circuits with a conductive interlayer. Voltage is monitored in both cases, and voltage fluctuation could happen occasionally. When a voltage change occurs, it is necessary to determine whether it is a valid dendrite-detection signal or merely noise. For the method involving a non-conductive interlayer, one can simply wait for 1 min and see if the voltage remains at that level. But for methods involving conductive interlayers, it is more difficult to further analyze the signal since the charging process cannot be allowed to continue, because if it is indeed a dendrite-detection signal, there will be a short-circuit current that might cause a runaway within seconds.

Figure 13A:
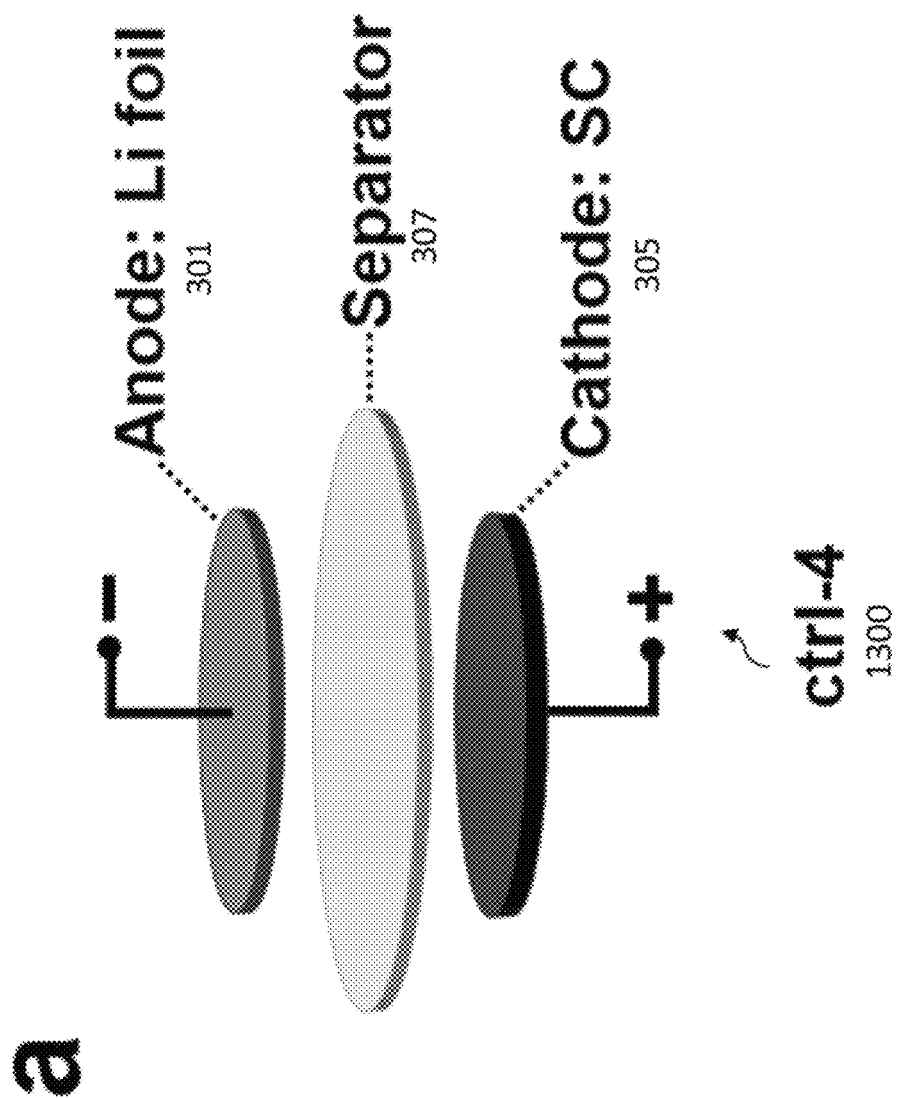
FIG. 13A shows the configuration of ctrl-4, which includes a separator without an RP coating.
Figure 13B:
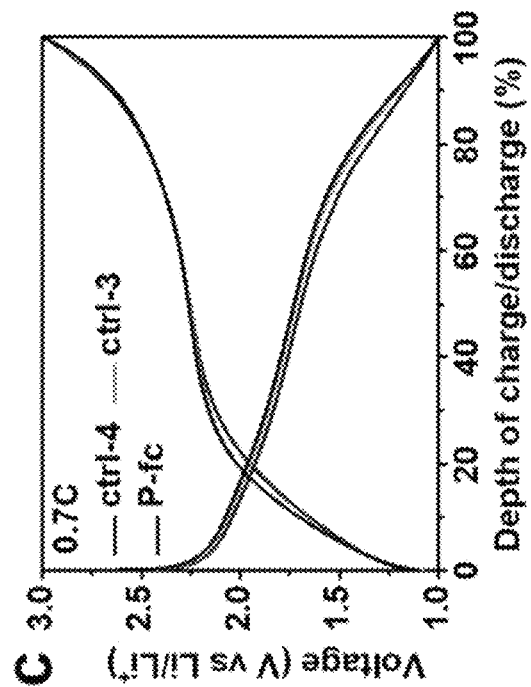
FIGS. 13B-13D are graphs showing normalized charge and discharge profiles of ctrl-4 (shown in FIG. 13), ctrl-3 (shown in FIG. 9C) and P-fc (shown in FIG. 9A) at 0.4 C, 0.7 C and 1.3 C, respectively.
Figure 13C:
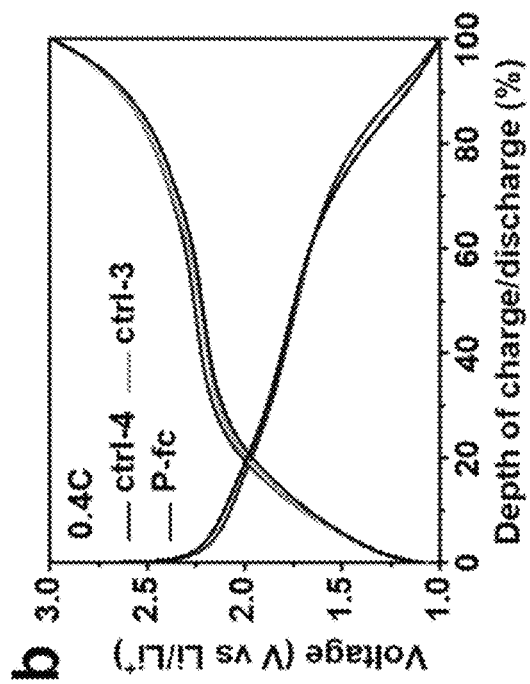
Figure 13D:
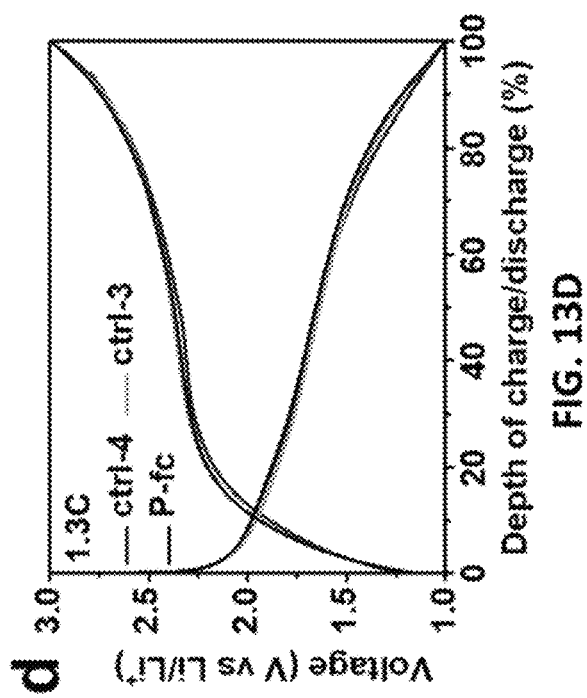

SEM analysis and EDS mapping were conducted at different stages of dendrite growth in full-cells (FIGS. 11A-11N and FIGS. 12A-12C), which displayed the dendritic structures of the Li metal attached to the RP in both P-fc and ctrl-3. As shown in FIGS. 13A-13D and TABLE 1, the RP did not lower the specific capacity of the sulfurized carbon or bring in significant overpotential when full-cells are cycled normally. (FIG. 13A shows control sample 1300 (ctrl-4), which is similar to control sample 906 (ctrl-3) but has only one separator 907) Additionally, it was found that 12 μm-thick polyethylene separators (in place of Celgard 2500 separators) worked equally well. The mass loading of sulfurized carbon was ~8 mg/cm$^2$.

TABLE 1

The specific capacity of the full-cells (ctrl-4, ctrl-3 and P-fc) based on the mass of sulfurized carbon at 0.4 C, 0.7 C and 1.3 C

|        | 0.4 C     | 0.7 C     | 1.3 C     |
|--------|-----------|-----------|-----------|
| ctrl-4 | 502 mAh/g | 401 mAh/g | 322 mAh/g |
| ctrl-3 | 489 mAh/g | 415 mAh/g | 305 mAh/g |
| P-fc   | 496 mAh/g | 411 mAh/g | 315 mAh/g |

Mechanism of Dendrite Detection in Half-Cells

Figure 14A:
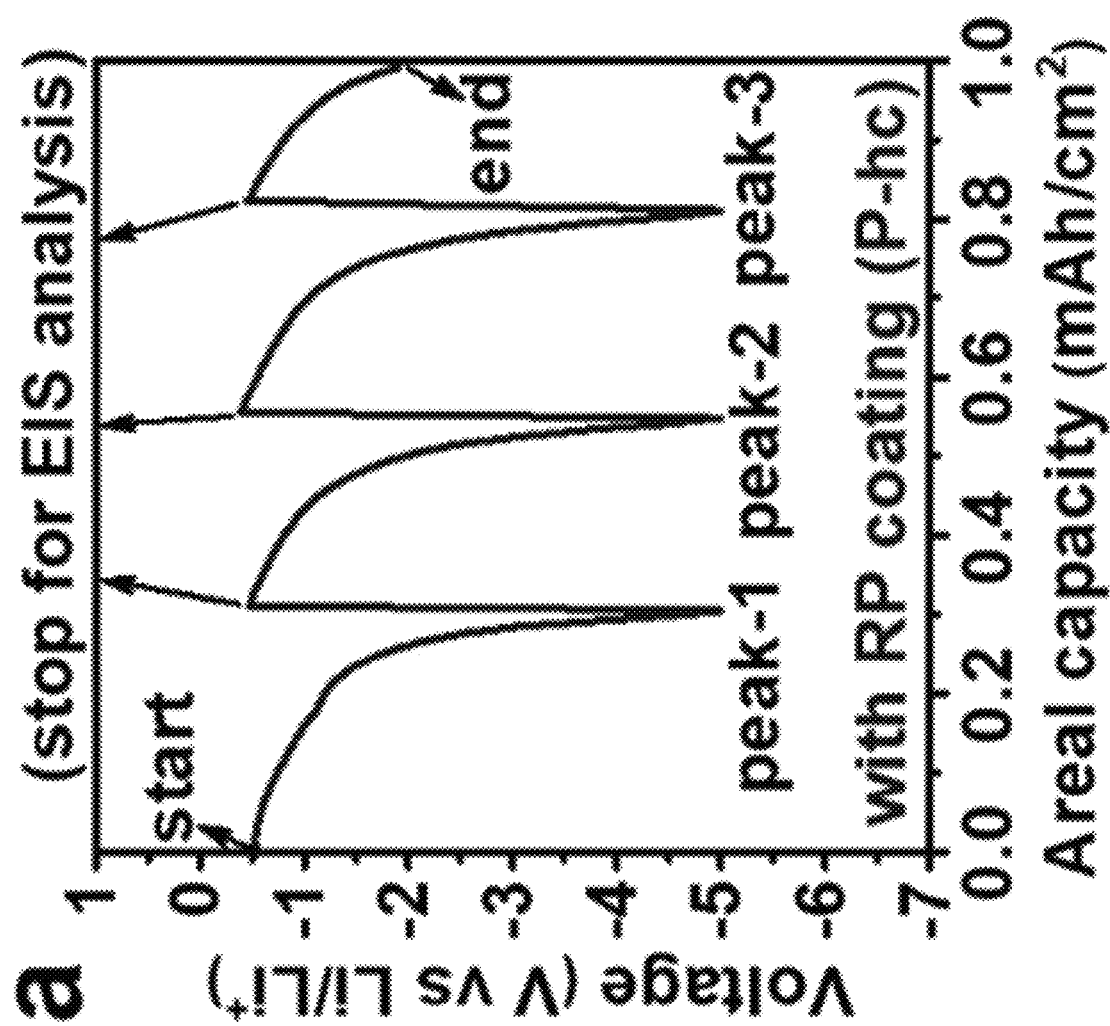
FIGS. 14A-14E show a mechanistic study of voltage change upon dendrite contact.
Figure 14B:
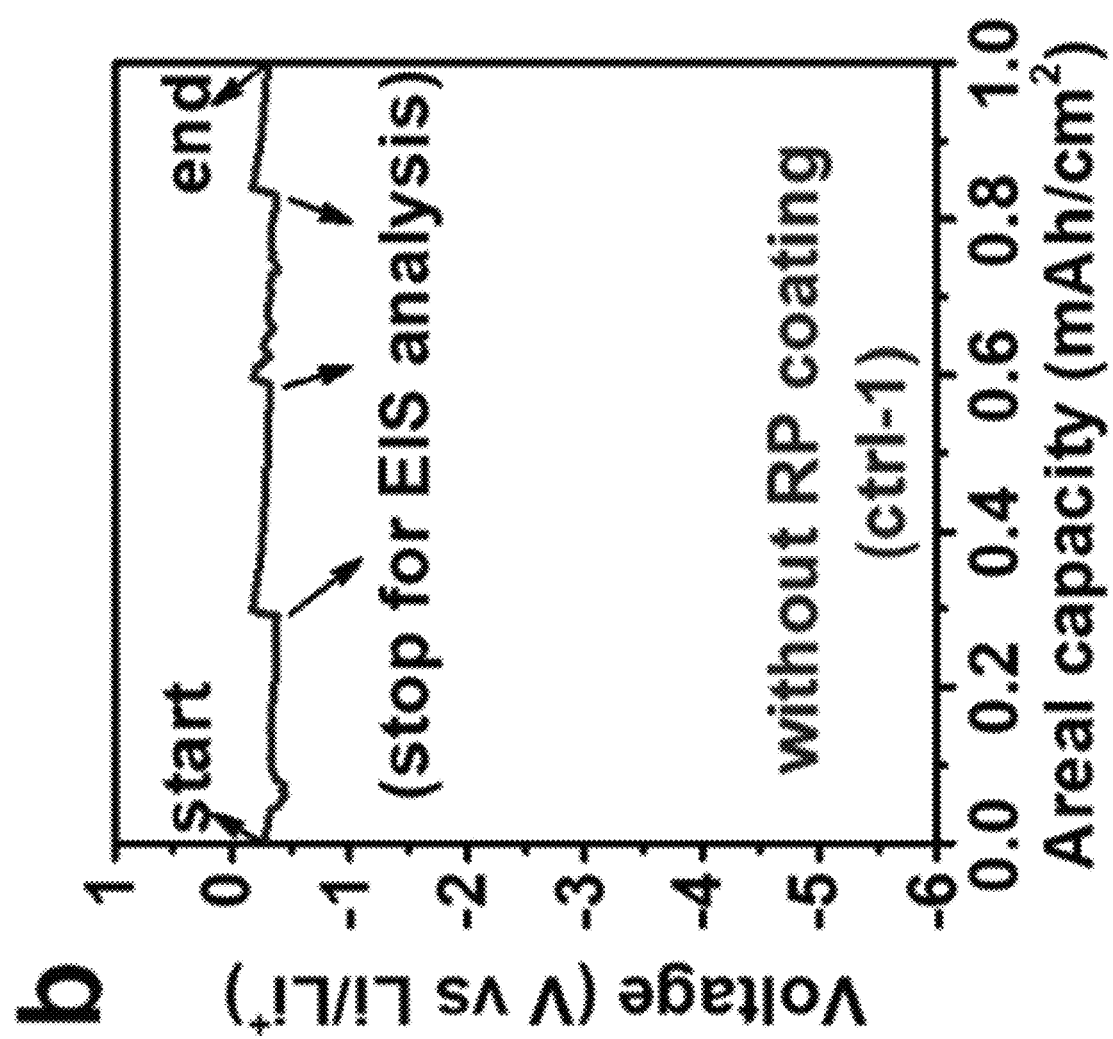

High resistance is often an obvious reason for having an overpotential in batteries. Therefore, the mechanism was studied in half-cells where the impact of the cathode can be avoided. Electrolyte resistance and charge transfer resistance of P-hc were analyzed by electrochemical impedance spectroscopy (EIS) analyses (FIGS. 14A-14B) [Zhang 2004; Liu 2008], because the anode might have consumed a significant amount of electrolyte for SEI formation.

Figure 14C:
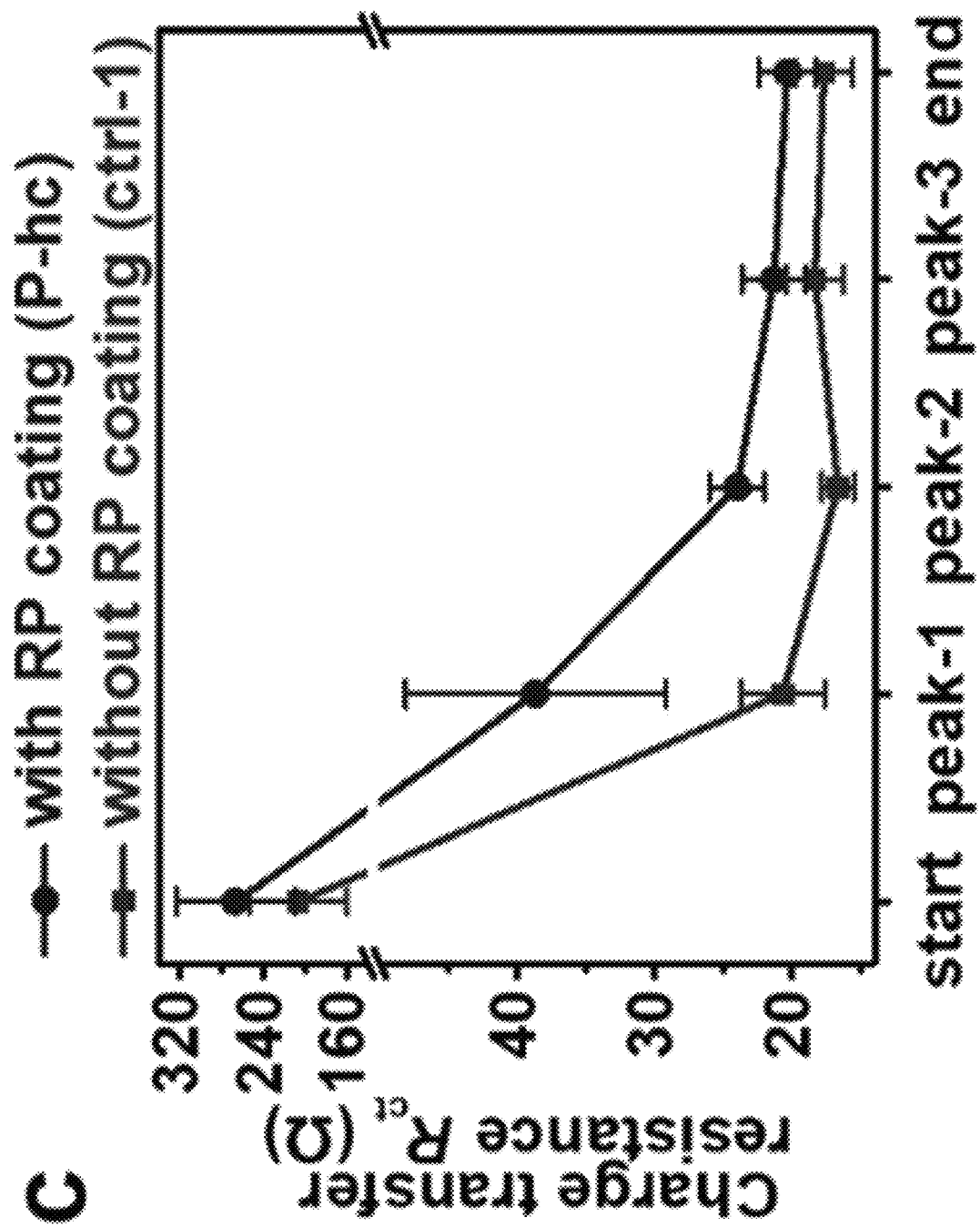
Figure 15D:
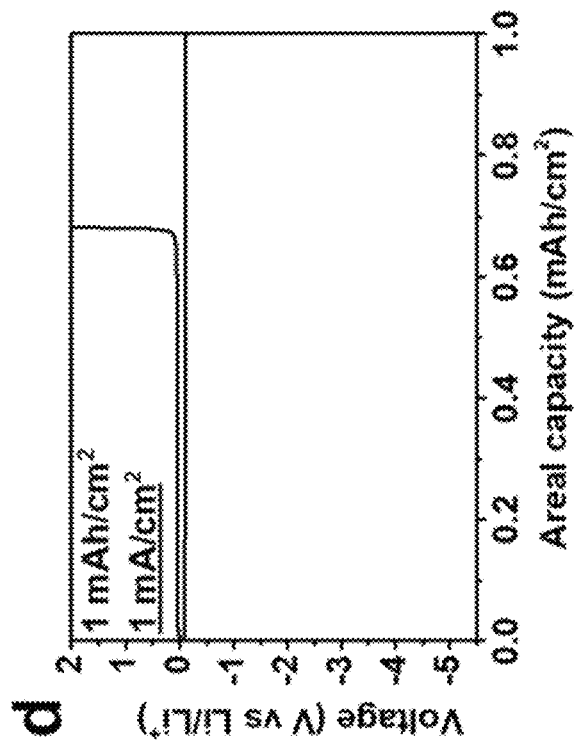
Figure 15C:
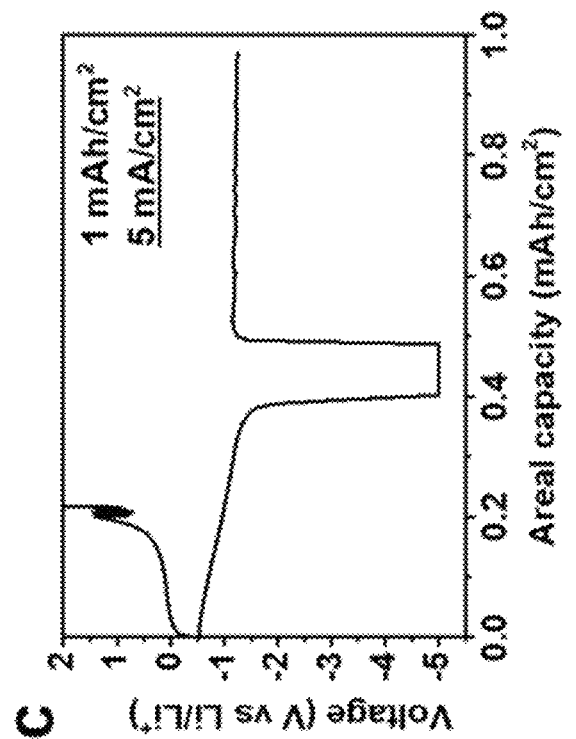

FIG. 15A shows the testing protocol where the times of electrolyte resistance measurement are marked at the 10$^{th}$, 70$^{th}$, and 71$^{st}$ cycles. FIG. 15B shows the electrolyte resistance of the P-hc. FIG. 15C shows the voltage profile at 1 mAh/cm$^2$ and 5 mA/cm$^2$ (the 71$^{st}$ cycle in FIG. 15A). FIG. 15D shows the voltage profile for the cycle at 1 mAh/cm$^2$ and 1 mA/cm$^2$ (after 71$^{st}$ cycle in FIG. 15A). The electrolyte resistance only increased by ~3Ω over cycling at low capacity (FIG. 15A-15B). As shown in FIG. 14C, the difference of charge-transfer resistance between P-hc and ctrl-1 was also <5Ω (peak-3 and end in FIG. 14C). [Zhang 2004; Liu 2008]. Moreover, as shown in FIGS. 15C-15D, the voltage decrease disappeared when the discharge rate was reduced to 1 mA/cm$^2$. These reflect that the voltage change was not generated by large resistance.

Figure 14D:
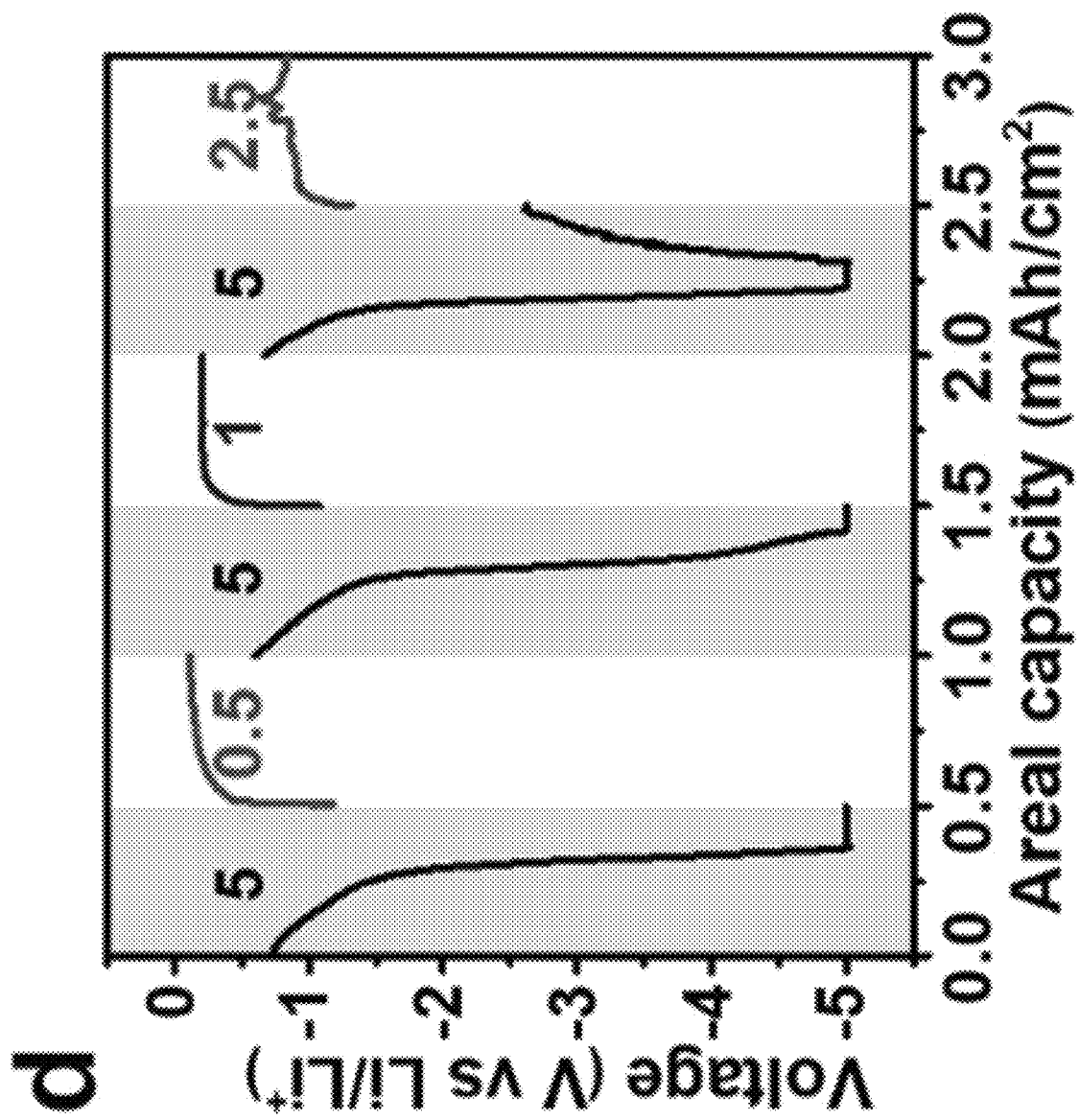

The high rate was found important: lower discharge rates (0.50/1.0/2.5 mA/cm$^2$) could not generate the voltage decrease. See FIG. 14D. The insulating property of the dendrite-detection interlayer was also essential. Graphene nanoplatelets (GNPs) were added in the RP coating using different P/GNP ratios. With a GNP content of >50 wt %, the voltage change was not observed.

Figure 16B:
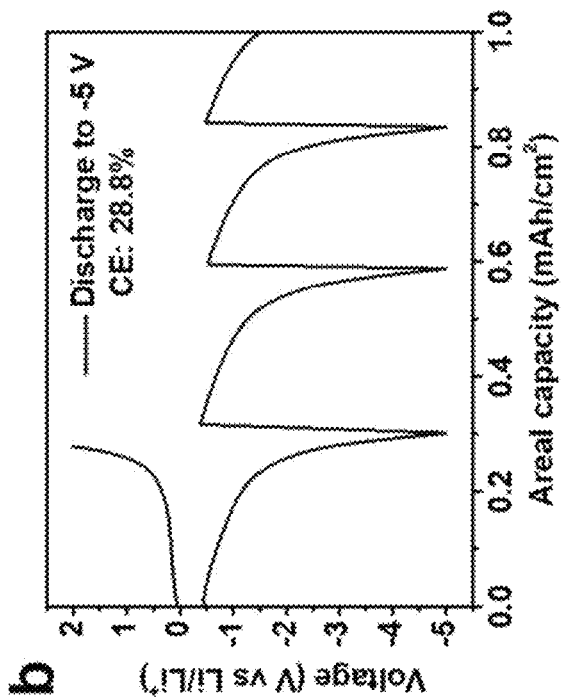
FIGS. 16A-16B are graphs showing the voltage of P-hc discharged at various voltages.
Figure 16A:
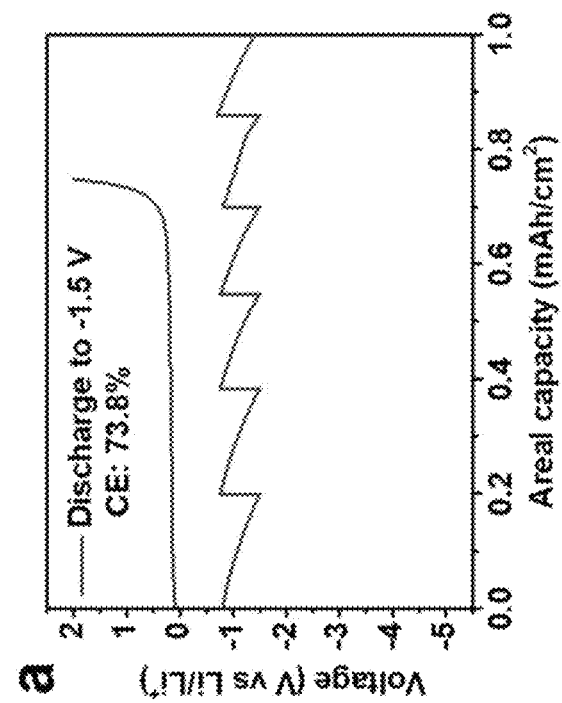

FIGS. 16A-16B show, respectively, the voltage profile of P-hc discharged above (a) −1.5 V and (b) −5 V (lower voltage limit of the instrument) at 5 mA/cm$^2$ and charged at 0.25 mA/cm$^2$. These show that when the discharge voltage was limited to above (i.e., less than) −1.5 V, this yielded a higher CE than discharging to −5 V. This reveals that a significant amount of irreversible side-products may be formed in the low voltage region, which could be non-rechargeable Li, e.g. the silver-colored spots on the RP shown in FIGS. 1F-1G.

Based these results, it is believed that the following mechanism is responsible for the voltage change. When a small capacity was applied, the dendrites did not reach the RP coating (FIG. 14E, stage 410(I)). The ends of dendrites were fully exposed to electrolyte solution and were accessible for the charge transfer that resulted in Li plating. (Numbers I to III represent different stages (namely stages 1410(I)-1410(III)) of dendrite growth.

Figure 14E:
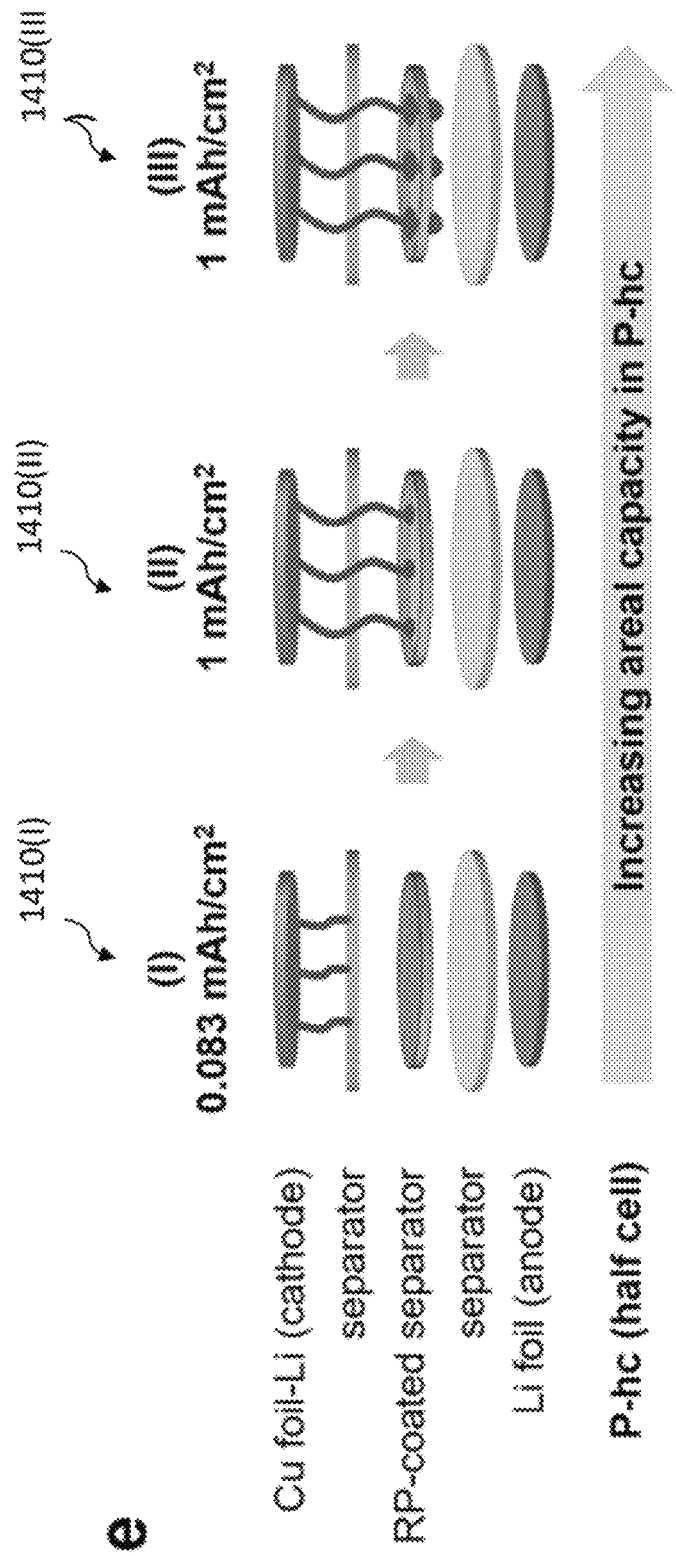

When the capacity was increased to around 1 mAh/cm$^2$, the dendrites penetrated the bottom separator and reached the RP layer (FIG. 14E, stage 1410(II)). The dendrites developed electrical contact with RP by forming Li$_3$P at the interface. [Mayo 2016]. Note that RP has a very low electronic conductivity of around $10^{-14}$ S cm$^{-1}$ and the local current density was exceedingly high on the dendrites under high bulk current density. [Li 2016; Harry 2016]. Consequently, it is believed, electrons were blocked at the interface between the dendrites and RP, and thus the electrons accumulated on the dendrite tips, lowering the electrode potential. Under these conditions, the reaction between Li+ and electrons became the rate-determining step of the entire discharge process due to the limited access of Li+ in the electrolyte solution to the dendrite tips and the electrons that had to inevitably flow through them.

As dendrites continued to grow, albeit slower, they bypassed the RP particles or extended their surface underneath the RP particles to become exposed to the electrolyte again (FIG. 14E, stage 1410(III)). This explains why the voltage eventually returned to its near-original level. [See FIG. 1D]. The Li dendrites that irreversibly transferred onto the RP interlayer created additional electron pathways for Li plating through the RP interlayer; the RP was no longer an effective barrier to electrons and Li$^+$ ions after several cycles, and the voltage decrease eventually disappeared.

This mechanism can also be interpreted in another way that the cathode is treated as a supercapacitor. The cathode has both double-layer capacitance ($C_1$) that is responsible for the electrostatic charge storage (e.g. negatively charged Cu—Li and physically absorbed Li ions) and pseudocapacitance that is responsible for the electrochemical charge storage (e.g. thin layer of Li plating). The total capacitance $C=C_1+C_2$. When Li dendrites contacted RP, a thin layer of Li$_3$P was generated at the interface which served as a dielectric that increased $C_1$. Meanwhile, the Li$_3$P layer blocked the incoming Li ions from the electrolyte and impeded further Li plating, which significantly reduced $C_2$. Note that $C_2$ was much larger than $C_1$. Thus, the change in C was dominated by the sharp decrease in $C_2$, meaning that the total capacitance C would sharply decline. This resulted in a much smaller $|dQ/dV|$ (C=Q/V), which displayed in the voltage profile as a sudden increase in $|dV/dt|$, given the constant current in the discharge process (Q=It).

It may therefore be important to stop charging and halt cell use at the first or second indication of significant voltage change.

In practice, different charge modes can be developed based on this dendrite-detection system if high charge voltage or high charge rate is not applicable. When dendrites form and reach the RP-coated separator layer in full-cells, the charging voltage will reach the upper limit much sooner than expected, triggering another detection protocol to rule out the possibility of random voltage fluctuation. For instance, the charge mode can be switched from voltage-control constant-current (e.g., 5 mA/cm$^2$ corresponding to ~2 C for commercial pouch cells) charging to voltage-control charging. If the voltage remains at the upper limit with a current density no higher than the constant value used right before (5 mA/cm$^2$) for a significant amount of time such as 1 min, it is likely that severe dendrite formation is present. This also reduces the dendrite growth rate and thus the damage to the cell, because the total current becomes lower.

Another option is to let the cell rest for a certain amount of time to have the accumulated electrons dissipated, so that the voltage might drop back to the normal range and rise to the upper limit rapidly again, which would confirm the presence of dendrite formation.

When high charge rate (5 mA/cm$^2$) is not always applicable, it could be applied periodically (e.g., every 30 cycles) in the charge steps to reveal possible dendrite formation before it is too late. It is upon such algorithms that the battery management system can be programmed. For example, suppose a battery management system charges a multi-cell battery module at an average cell rate optimized for the module or charging environment but below what is required or optimal for dendrite detection. The battery management system can periodically subject subsets of the cells, in turn, to a higher charge rate suitable for dendrite detection.

Method of Dendrite Detection Using RP-Coated Separators

Embodiments of the present invention can be applied in batteries with metal electrodes for consumer electronics and electric/hybrid vehicles.

The reagent partition detects dendrite formation before the dendrites short the cell, and therefore ensures safe operation of Li metal cells such that dendrite formation is no longer a major concern when using Li metal anodes.

The reagent partition can be electrically isolated within the cell absent dendrite contact, and thus does not require an electrode for dendrite detection. Electrodeless reagent partitions thus facilitate dendrite detection in two-terminal cells. Only a thin RP coating between the cathode and the anode is added in the current battery configuration during the making of the battery.

The formation of dendrite is detected by simply monitoring the charge voltage during the use of the battery beyond a certain charge rate.

In embodiments of the present invention, the method can include one or more of the following steps: preparation of the RP-coated separators, performing electrochemical tests (battery tests and EIS analysis); and instructions on its practical use.

For example with regard to preparation of the RP-coated separators, RP and PVDF (binder) can be mixed in a mortar at a mass ratio of 9:1. NMP was added to form a slurry after grinding for 5 min. The slurry was coated on a Celgard 2500 separator and dried in a vacuum oven (~1 Torr) at 60° C. overnight. The mass loading of RP was ~2 mg/cm$^2$.

Further, for example with regard to electrochemical tests (battery tests and EIS analysis), the half-cells and full-cells were assembled using LiPF$_6$ in EC/DEC (v/v=1/1) as the electrolyte solution.

Further, for example with regard to instructions on its practical use, in practical applications, when a user wants to check if there is severe dendrite formation in the battery, a specific testing program can be activated to start charging the battery (such as at ≥5 mA/cm$^2$) while the voltage is monitored by the battery management system. Once the charge voltage reaches 2 V higher than the maximum charge voltage used in normal charge steps and stays ≥2 V higher for a predetermined period (such as 30 seconds), the battery system can e.g. disconnect the errant cell or sells or warn the user of the hazardous condition of the battery and recommend shutting it down instantly.

Battery Management Systems

Battery-management systems can use signals generated by electrodeless regent partitions to detect dendrites before they present an imminent threat of failure. Effected cells, batteries, or modules can thus be physically or electrically removed, and harm averted.

The battery-management system can test for dendrites in a cell, battery, or module by periodically measuring full-charge timing of the device. The full-charge timing is a function of charging current and a full-charge voltage applied between the anode and cathode. Full-charge timing changes over the life of a device so the system periodically updates and stores a full-charging model for a given device. The model can be simple, such as a measure of the time required to reach a full-charge voltage. More complex models can estimate full-charge timing based on e.g. current state of charge, charging voltage, charging current, and temperature. The full-charging model, derived from measure and/or simulation, can provide the system with expected full-charge timing for a device under a range of charging scenarios.

In some embodiments the system monitors charging time and voltage, issuing a tentative dendrite-detection signal if the charging voltage reaches the full-charge voltage, or some other threshold, sooner than expected based on the full-charging model. In one embodiment, for example, the management system issues a tentative dendrite-detection signal if a device under charge reaches the full-charge voltage within 80% of the full-charge timing predicted by the device-specific full-charging model.

Voltage readings over short periods can be inaccurate. The management system can thus continue to monitor a suspect cell, battery, or module before affirming the tentative dendrite detection. In one embodiment, the system adjusts the charging current responsive to the tentative dendrite-detection signal to limit the charging voltage to e.g. the full-charge voltage. The system can then issue an affirmative dendrite-detection signal if the charging current responsive to that constant charging voltage falls below a threshold. For example, the system may affirm dendrite detection if the charging falls for, e.g., 10 seconds while the battery is being charged at the full-charge voltage.

The battery-management system may periodically subject each battery to a charge current that is sufficiently high to ensure a robust dendrite-detection. In one embodiment in which the energy-storage device is a lithium-metal battery, for example, the system subjects the battery to a charging current of at least 2.5 mA/cm$^2$. Systems with many devices under management and insufficient power to provide all devices with the requisite level of current can test the devices in turn.

When dendrites are detected by periodic tests, the battery-management system may compare the full-charge time of a dendrite-detection step to the last cycle that used the same charge current. This allows the system to recognize the differences coming from the dendrite formation. For periodic tests, the last cycle that used the same current may have been many cycles ago, so the stored full-charge time may no longer be comparable. The system is therefore adapted to simulate the full-charging model at the high current needed for dendrite detection based on the normal charge curve at a lower current before performing a dendrite-detection process.

In one embodiment, a RP-coated separator was used for dendrite detection and was prepared by the slurry method using N-methyl-2-pyrrolidone (NMP) as the solvent and poly(vinylidene difluoride) (PVDF) as the binder. The RP layer had a thickness of ~20 μm with a mass loading of ~2 mg/cm$^2$. The RP layer was physically isolated from the electrodes. The bottom separator was optional because the separator upon which RP was coated is enough to isolate the RP layer from the anode.

When Li dendrites extended to the RP coating, there was a noticeable and dramatic electrochemical response in the voltage profile (voltage vs capacity or time). The voltage decreased in half cells or increased in full cells when Li dendrites contact the RP. These voltage changes can activate a signal of Li dendrite formation through the battery management system that is installed on all recharging devices.

Additional Variations

In some embodiments, the loading of the RP can be modified (such as the loading is reduced).

In some embodiments, the preparation method can include one or more of the following:

The RP coating can be formed using various techniques, including but not restricted to spray coating, filtration, and physical/chemical deposition and doctor blade methods.

The RP coating can be impregnated in the middle of the separator when the separator is produced.

The RP can be in the form of a free-standing film.

The method of preparation can include (a) the RP coating can be formed using various techniques, including but not restricted to spray coating, filtration, and physical/chemical deposition and doctor blade methods, (b) the RP coating can be impregnated in the middle of separator when the separator is produced, and (c) the RP can be in the form of a free-standing film.

In some embodiments, the use of the RP coating can include one or more of the following:

The type of batteries includes but is not restricted to coin cells, cylindrical cells, prismatic cells, and pouch cells.

The type of batteries includes but is not restricted to Li, Na, K, Mg, Ca, Al, and Zn metal batteries.

The type of separator that RP is coated on can be any separator that works for a battery.

Battery electrolyte is not necessarily $LiPF_6$. The RP coating can work for any kind of battery electrolyte, as long as the active material in the anode or cathode includes metals.

Embodiments of the present invention can be applied in batteries with metal electrodes for consumer electronics and electric/hybrid vehicles.

In some embodiments, the use of the RP coating can include (a) the type of batteries including, but is not restricted to, coin cells, cylindrical cells, prismatic cells, and pouch cells, (b) the type of batteries, including, but is not restricted to, Li, Na, K, Mg, Ca, Al, and Zn metal batteries, (c) the type of separator that RP is coated on can be any separator that works for a battery, and (d) battery electrolyte is not necessarily $LiPF_6$. The RP coating can work for any kind of battery electrolyte, as long as the active material in the anode or cathode includes metals.

In some embodiments, the composition of the coating need not be RP only. The coating can be made from anything that is a poor electronic conductor, able to react with Li, and forms an insoluble or slightly soluble product with Li. This includes but is not restricted to Si, Ge, As, metal oxides, metal fluorides, $LiM_xE_yO^z$ (M=metal, E=nonmetal, O=oxygen, x≥0, y≥0, z≥0), and any combination of the above In some embodiments, the separator that contains the RP coating can be situated in the middle.

REFERENCES

Armand, M. et al., Building Better Batteries. *Nature* 2008, 451 (7179), 652-657 ("Armand 2008").

Bruce, P. G. et al., Li—O2 and Li—S Batteries with High Energy Storage. *Nat. Mater.* 2011, 11 (2), 172-172 ("Bruce 2011").

Cano, Z. P. et al., Batteries and fuel cells for emerging electric vehicle markets *Nat. Energy.* 2018, 3, 279-289 ("Cano 2018").

Cheng, X. B. et al., Toward Safe Lithium Metal Anode in Rechargeable Batteries: A Review. *Chem. Rev.* 2017, 117, 10403-10473 ("Cheng 2018").

Ding, F. et al., Dendrite-free lithium deposition via self-healing electrostatic shield mechanism. *J. Am. Chem. Soc.* 2013, 135, 4450-4456 ("Ding 2013").

Dunn, B.; Kamath, H. et al., Electrical Energy Storage for the Grid: A Battery of Choices. *Science* (80). 2011, 334 (6058), 928-935 ("Dunn 2011").

Goodenough, J. B. et al., The Li-Ion Rechargeable Battery: A Perspective. *J. Am. Chem. Soc.* 2013, 135 (4), 1167-1176 ("Goodenough 2013").

Girishkumar, G. et al., Lithium-Air Battery: Promise and Challenges. *J. Phys. Chem. Lett.* 2010, 1 (14), 2193-2203 ("Girishkumar 2010").

Harry, K. J. et al., Influence of Electrolyte Modulus on the Local Current Density at a Dendrite Tip on a Lithium Metal Electrode. *J. Electrochem. Soc.* 2016, 163, A2216-A2224 ("Harry 2016").

Li, L. et al., Self-heating-induced healing of lithium dendrites. *Science* 2018, 359, 1513-1516 ("Li 2018").

Li, W. et al., Amorphous Red Phosphorus Embedded in Highly Ordered Mesoporous Carbon with Superior Lithium and Sodium Storage Capacity. *Nano Lett.* 2016, 16, 1546-1553 ("Li 2016").

Lin, D. et al., All-Integrated Bifunctional Separator for Li Dendrite Detection via Novel Solution Synthesis of a Thermostable Polyimide Separator. *J. Am. Chem. Soc.* 2016, 138, 11044-11050 ("Lin I 2016").

Lin, D. et al., Layered reduced graphene oxide with nanoscale interlayer gaps as a stable host for lithium metal anodes. *Nat. Nanotechnol.* 2016, 11, 626-632 ("Lin II 2016").

Liu, B. et al., Advancing Lithium Metal Batteries. *Joule* 2018, 2, 833-845 ("Liu 2018").

Liu, K. et al., Extending the Life of Lithium-Based Rechargeable Batteries by Reaction of Lithium Dendrites with a Novel Silica Nanoparticle Sandwiched Separator. *Adv. Mater.* 2017, 29, 1603987 ("Liu 2017").

Liu, S.-Q. et al., Kinetic study on $Li_{2.8}(V_{0.9}Ge_{0.1})_2(PO_4)_3$ by EIS measurement. *J. Alloys Compd.* 2008, 450, 499-504 ("Liu 2008").

Manthiram, A. et al., Lithium-Sulfur Batteries: Progress and Prospects. *Adv. Mater.* 2015, 27 (12), 1980-2006 ("Manthiram 2015").

Mayo, M. et al., Ab Initio Study of Phosphorus Anodes for Lithium- and Sodium-Ion Batteries. *Chem. Mater.* 2016, 28, 2011-2021 ("Mayo 2016").

Noorden, R. Van, The Rechargeable Revolution: A Better Battery. *Nature* 2014, 507, 26-28 ("Noorden 2014").

Orsini, F. et al., In situ SEM study of the interfaces in plastic lithium cells, *J. Power Sources.* 1999, 81-82, 918-921 ("Orsini 1999").

Qian, J. et al., High rate and stable cycling of lithium metal anode *Nat. Commun.* 2015, 6, 6362 ("Quia 2015")

Raji, A. O. et al., Lithium Batteries with Nearly Maximum Metal Storage *ACS Nano* 2017, 11, 6362-6369 ("Raji 2017").

Shen, X. et al., Beyond lithium ion batteries: Higher energy density battery systems based on lithium metal anodes. *Energy Storage Mater.* 2018, 12, 161-175 ("Shen 2018").

Wang, T. et al., Ultrafast Charging High Capacity Asphalt-Lithium Metal Batteries. *ACS Nano* 2017, 11, 10761-10767 ("Wang 2017").

Wood, K. N. et al., Dendrites and Pits: Untangling the Complex Behavior of Lithium Metal Anodes through Operando Video Microscopy. *ACS Cent. Sci.* 2016, 2, 790-801 ("Wood 2016").

Wu, H. et al., Improving Battery Safety By Early Detection Of Internal Shorting With A Bifunctional Separator. *Nat. Commun.* 2014, 5, 5193-5198 ("Wu 2016").

Xu, W. et al., Lithium Metal Anodes for Rechargeable Batteries. *Energy Environ. Sci.* 2014, 7 (2), 513-537 ("Xu 2014").

Zhang, J.-G. et al., *Lithium Metal Anodes and Rechargeable Lithium Metal Batteries*, 1st ed.; Hull, R. et al., Eds.; Springer International Publishing, 2017 ("Zhang 2017").

Zhang, S. S. et al., Electrochemical impedance study on the low temperature of Li-ion batteries. *Electrochimi. Acta* 2004, 49, 1057-1061 ("Zhang 2004").

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein. This writing takes precedence over the incorporated materials for purposes of claim construction.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. An energy-storage device with dendrite detection, the energy-storage device comprising:
    (a) an anode;
    (b) a cathode;
    (c) an electrolyte containing cations of a metal, wherein the electrolyte is disposed between the anode and the cathode; and
    (d) an electrodeless dendrite-detection interlayer in the electrolyte between the anode and the cathode, the dendrite-detection interlayer to generate a voltage change detectable between the anode and the cathode responsive to dendrites of the metal extending from the anode to the dendrite-detection interlayer, wherein
        (i) the electrodeless dendrite-detection interlayer consists essentially of red phosphorus.

2. The energy-storage device of claim 1, wherein the metal comprises lithium.

3. The energy-storage device of claim 1, wherein the dendrite-detection layer comprises at least one material selected from a group consisting of silicon, germanium, arsenic, metal oxides, metal fluorides, and LiMxEyOz with M=metal, E=nonmetal, O=oxygen, and x≥0, y≥0, and z≥0.

4. The energy-storage device of claim 1 further comprising a separator extending through the electrolyte between the dendrite-detection interlayer and the anode.

5. The energy-storage device of claim 4, wherein the dendrite-detection interlayer is disposed on the separator.

6. The energy-storage device of claim 1, wherein the dendrite-detection interlayer is an electrical insulator.

7. The energy-storage device of claim 6, wherein the dendrite-detection interlayer has a conductivity of less than $10^{-5}$ S/cm.

8. The energy-storage device of claim 1, wherein the electrolyte is a liquid.

9. The energy-storage device of claim 1, wherein the electrodeless dendrite-detection interlayer comprises multiple separator layers.

10. An energy-storage device with dendrite detection, the energy-storage device comprising:
    (a) an anode;
    (b) a cathode;
    (c) an electrolyte containing cations of a metal, wherein
        (i) the electrolyte is disposed between the anode and the cathode, and
        (ii) the metal comprises lithium; and
    (d) an electrodeless dendrite-detection interlayer in the electrolyte between the anode and the cathode, the dendrite-detection interlayer to generate a detectable electrical response between the anode and the cathode responsive to dendrites of the metal extending from the anode to the dendrite-detection interlayer, wherein
        (i) the dendrite-detection layer comprises phosphorous that reacts with the lithium to generate the detectable electrical response between the anode and the cathode.

11. The energy-storage device of claim 10, wherein the dendrite-detection layer comprises red phosphorous.

* * * * *